United States Patent
Cliff et al.

(10) Patent No.: US 6,392,438 B1
(45) Date of Patent: *May 21, 2002

(54) PROGRAMMABLE LOGIC ARRAY INTEGRATED CIRCUIT DEVICES

(75) Inventors: Richard G. Cliff, Milpitas; Srinivas T. Reddy, Santa Clara; David Edward Jefferson, San Jose; Rina Raman, Fremont; L. Todd Cope, San Jose; Christopher F. Lane, Campbell; Joseph Huang, San Jose; Francis B. Heile, Santa Clara; Bruce B. Pedersen, San Jose; David Wolk Mendel, Sunnyvale; Craig Schilling Lytle, Mountain View; Robert Richard Noel Bielby, Pleasonton; Kerry Veenstra, San Jose, all of CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/684,148

(22) Filed: Oct. 6, 2000

Related U.S. Application Data

(63) Continuation of application No. 09/405,556, filed on Sep. 24, 1999, now Pat. No. 6,154,055, which is a continuation of application No. 08/970,830, filed on Nov. 14, 1997, now Pat. No. 5,986,470, which is a continuation of application No. 08/442,795, filed on May 17, 1995, now Pat. No. 5,689,195.

(51) Int. Cl.[7] .............................................. H03K 19/77
(52) U.S. Cl. ......................................... 326/41; 326/39
(58) Field of Search .............................. 326/38, 39, 40, 326/41

(56) References Cited

U.S. PATENT DOCUMENTS

| | | | |
|---|---|---|---|
| 3,473,160 A | 10/1969 | Wahlstrom | 340/172.5 |
| 4,609,986 A | 9/1986 | Hartmann et al. | 364/200 |
| 4,617,479 A | 10/1986 | Hartmann et al. | 307/465 |
| 4,642,487 A | 2/1987 | Carter | 307/465 |

(List continued on next page.)

FOREIGN PATENT DOCUMENTS

| | | | | |
|---|---|---|---|---|
| EP | 461798 | 12/1991 | ......... | H03K/19/177 |
| GB | 2283602 | 5/1995 | ......... | H03K/19/177 |
| WO | WO 94/10754 | 5/1994 | ......... | H03K/19/177 |
| WO | WO 95/22205 | 8/1995 | ......... | H03K/19/177 |

OTHER PUBLICATIONS

R. C. Minnick, "A Survey of Microcelluar Research," Journal of the Association for Computing Machinery, vol. 14, No. 2, pp. 203–241, Apr. 1967.

S.E. Wahlstrom, "Programmable Logic–Array—Cheaper by the Millions," Electronics, Dec. 11, 1967, pp. 90–95.

*Recent Developments in Switching Theory*, A. Mukhopadhyay, ed., Academic Press, New York, 1971, chapters VI and IX, pp. 229–254 and 369–422.

(List continued on next page.)

*Primary Examiner*—Michael Tokar
*Assistant Examiner*—V. Tan
(74) *Attorney, Agent, or Firm*—Fish & Neave; Robert R. Jackson; Joo-Youn Park

(57) ABSTRACT

A programmable logic array integrated circuit device includes a plurality of regions of programmable logic disposed on the device in a two-dimensional array of intersecting rows and columns. Interconnection conductors are associated with each row and column. The interconnection conductors associated with each row include some that extend continuously along the entire length of the row and some that extend continuously along only the left or right half of the row. To increase the flexibility with which the logic regions can be connected to the row and column conductors, adjacent regions are paired and circuitry is provided for allowing the outputs of each pair to be swapped for driving the row and column conductors. Registers in logic regions can still be used for other purposes when not being used to register the main combinatorial outputs of the logic regions. Many other enhanced features are also provided.

20 Claims, 11 Drawing Sheets

U.S. PATENT DOCUMENTS

| | | | |
|---|---|---|---|
| 4,677,318 A | 6/1987 | Veenstra | 307/465 |
| 4,713,792 A | 12/1987 | Hartmann et al. | 364/900 |
| 4,758,745 A | 7/1988 | Elgamal et al. | 307/465 |
| 4,774,421 A | 9/1988 | Hartmann et al. | 307/465 |
| 4,871,930 A | 10/1989 | Wong et al. | 307/465 |
| 4,899,067 A | 2/1990 | So et al. | 307/465 |
| 4,912,342 A | 3/1990 | Wong et al. | 307/465 |
| 5,023,606 A | 6/1991 | Kaplinsky | 340/825.8 |
| 5,073,729 A | 12/1991 | Greene et al. | 307/465.1 |
| 5,121,006 A | 6/1992 | Pedersen | 307/465 |
| 5,122,685 A | 6/1992 | Chan et al. | 307/465.1 |
| 5,132,571 A | 7/1992 | McCollum et al. | 307/465.1 |
| 5,144,166 A | 9/1992 | Camaroto et al. | 307/465.1 |
| 5,208,491 A | 5/1993 | Ebeling et al. | 307/465 |
| 5,220,214 A | 6/1993 | Pedersen | 307/465 |
| RE34,363 E | 8/1993 | Freeman | 307/465 |
| 5,258,668 A | 11/1993 | Cliff et al. | 307/465 |
| 5,260,610 A | 11/1993 | Pedersen et al. | 307/465 |
| 5,260,611 A | 11/1993 | Cliff et al. | 307/465 |
| 5,274,581 A | 12/1993 | Cliff et al. | 364/784 |
| 5,350,954 A | 9/1994 | Patel | 307/465 |
| 5,371,422 A | 12/1994 | Patel et al. | 326/41 |
| 5,448,186 A | 9/1995 | Kawata | 326/41 |
| 5,455,525 A * | 10/1995 | Ho et al. | 326/41 |
| 5,483,178 A | 1/1996 | Costello et al. | 326/41 |
| 5,509,128 A | 4/1996 | Chan | 395/311 |
| 5,682,107 A | 10/1997 | Tavana et al. | 326/41 |
| 5,689,195 A | 11/1997 | Cliff et al. | 326/41 |
| 5,986,470 A | 11/1999 | Cliff et al. | 326/41 |
| 6,154,055 A | 11/2000 | Cliff et al. | 326/41 |

OTHER PUBLICATIONS

*The Programmable Gate Array Data Book,* (see especially pp. 2–12) 1988, Xilinx, Inc., San Jose, CA.

El Gamal et al., "An Architechture for Electrically Configurable Gate Arrays," IEEE Journal of Solid–State Circuits, vol. 24, No. 2, Apr. 1989, pp. 394–398.

El–Ayat et al., "A CMOS Electrically Configurable Gate Array," IEEE Journal of Solid–State Circuits, vol. 24, No. 3, Jun. 1989, pp. 752–762.

*ACT Family Field Programmable Gate Array Databook,* Apr. 1992, Actel Corporation, Sunnyvale, CA, pp. 1–35 through 1–44.

*The Programmable Logic Data Book,* 1994, Xilinx, Inc., San Jose, CA, pp. 2–7, 2–12, and 2–13.

"XC5000 Logic Cell Array Family, Technical Data, Advance Information," Xilinx, Inc., February 1995.

* cited by examiner

PROGRAMMABLE LOGIC ARRAY INTEGRATED CIRCUIT DEVICES

This is a continuation of application No. 09/405,556, filed Sep. 24, 1999 (now U.S. Pat. No. 6,154,055), which was a continuation of application No. 08/970,830, filed Nov. 14, 1997 (now U.S. Pat. No. 5,986,470), which was a continuation of application No. 08/442,795, filed May 17, 1995 (now U.S. Pat. No. 5,689,195), and which is hereby incorporated by reference in its entirety.

BACKGROUND OF THE INVENTION

This invention relates to programmable logic array integrated circuit devices, and more particularly to improved features for such devices (e.g., improved programmable interconnectivity between the programmable logic regions of such devices).

Programmable logic array integrated circuit devices are well known, as shown, for example by Pedersen et al. U.S. Pat. No. 5,260,610 and Cliff et al. U.S. Pat. No. 5,260,611. Such devices often include a large number of regions of programmable logic disposed on the device in a two-dimensional array of intersecting "rows" and "columns" of such regions. Each region is programmable to perform any of several logic functions on signals applied to the region. Each row may have associated "horizontal" conductors for conveying signals to, from, and/or between the regions in the row. Each column may have associated "vertical" conductors for conveying signals from row to row. Programmable connections may be provided for selectively connecting the conductors adjacent to each region to the inputs and outputs of the region, and also for selectively connecting various conductors to one another (e.g., connecting a horizontal conductor to a vertical conductor). Interconnection of regions through the above-mentioned conductors and programmable connections makes it possible for the programmable logic array device to perform much more complicated logic functions than can be performed by the individual regions.

Advances in integrated circuit fabrication technology have made it possible to produce programmable logic array devices with very large numbers of logic regions. As the number of logic regions increases, however, it becomes increasingly important to select the numbers and arrangements of the interconnection conductors and the programmable connections between those conductors and the regions. Complete generality of these interconnection resources (i.e., so that any desired interconnection can be made no matter what other interconnections are made) would lead to exponential growth in the chip area occupied by those resources as the number of logic regions increases. This is especially disadvantageous in the case of reprogrammable devices because of the larger size and greater circuit loading and signal propagation delay of reprogrammable interconnection elements as compared to one-time-only programmable interconnection elements. (One-time-only programmable devices are shown, for example, El Gamal et al., "An Architecture for Electrically Configurable Gate Arrays," IEEE Journal of Solid-State Circuits, Vol. 24, No. 2, June 1989, pp. 394–98; El-Ayat et al., "A CMOS Electrically Configurable Gate Array," IEEE Journal of Solid-State Circuits, Vol. 24, No. 3, June 1989, pp. 752–62; and Elgamal et al. U.S. Pat. No. 4,758,745.) Moreover, most of any completely general interconnection resources would be unused and therefore wasted in virtually all applications of the device. On the other hand, many applications of the device may require substantial interconnection resources, and because the device is intended to be a general-purpose device, it is extremely important to commercial success that the device be capable of satisfying a very wide range of potential applications, many of the requirements of which cannot be known in advance by the designer of the programmable logic array device.

Considerations such as the foregoing make it essential to provide increasingly sophisticated interconnection resources in programmable logic array devices, and especially in reprogrammable logic array devices. The aim is to hold down the fraction of the "real estate" of the chip that is devoted to interconnection resources, e.g., by optimizing various features of those resources, by increasing the flexibility with which those resources can be used, etc. Moreover, this is preferably done without undue circuit loading and speed penalties due to passing signals through excessive numbers of switches or tapping conductors to large numbers of switches. (Compare the above-mentioned El Gamal, El-Ayat, and Elgamal references, as well such other references as Freeman U.S. Pat. No. Re. 34,363 and Carter U.S. Pat. No. 4,642,487, all of which rely heavily on programmably piecing together relatively short conductor segments when longer conductors are needed.)

In view of the foregoing it is an object of this invention to provide improved programmable logic array devices.

It is a more particular object of this invention to provide improved arrangements of interconnection resources on programmable logic array integrated circuits.

SUMMARY OF THE INVENTION

These and other objects of the invention are accomplished in accordance with the principles of the invention by providing programmable logic array integrated circuit devices having the traditional two-dimensional array of programmable logic regions with horizontal conductors associated with each row and vertical conductors associated with each column, but with the difference that some of the horizontal conductors associated with each row extend continuously or substantially continuously along only approximately half the length of the row. Thus each row is divided into two mutually exclusive halves, with some "half-horizontal" conductors extending along each of the two halves. In this way a half-horizontal conductor can be used to make connections to, from, and/or between logic regions in a half of the row without having to use a much longer than necessary full-horizontal conductor for this purpose. The full-horizontal conductors (which extend continuously or substantially continuously along the entire length of a row, and which are sometimes also referred to as global horizontal conductors) can be saved for signals that must be transmitted beyond either half of the row. Because two end-to-end half-horizontal conductors occupy the same space as one full-horizontal conductor, the provision of half-horizontal conductors makes more efficient use of the horizontal conductor real estate on the chip. In particular, the half-horizontal conductors allow the number of full-horizontal conductors to be reduced. Reducing the number of horizontal conductors also helps reduce the size of the programmable switch arrays used to programmably connect the horizontal conductors to the inputs of each logic region. Axially aligned and adjacent half-horizontal conductors are preferably not directly connectable to one another. Thus there is preferably no possibility of programmably optionally piecing together axially aligned half-horizontal conductors to make longer horizontal conductors. Instead, that longer horizontal conductor resource is the global horizontal conductors, which are preferably continuous or substantially continuous and not made up of pieced-together shorter conductors.

Each logic region output signal is preferably programmably connectable to one full-horizontal conductor and one half-horizontal conductor. Each full- and half-horizontal conductor associated with a row is drivable by either of two outputs of logic regions in that row. Each logic region output is also programmably connectable to a vertical conductor. Having two logic region outputs share each full- and half-horizontal conductor also helps to reduce the number of horizontal conductors that must be provided. Again, this helps reduce the size of the programmable switch arrays used to programmably connect the horizontal conductors to the inputs of each logic region.

Both the half-horizontal and the full-horizontal conductors are programmably output-connectable to so-called "horizontal" input/output ("I/O") pins for purposes of outputting signals from the chip. For purposes of inputting to the chip, both the half-horizontal and the full-horizontal conductors could be programmably input-connectable to the horizontal I/O pins, but in the preferred embodiments only the full-horizontal conductors are thus programmably input-connectable.

Certain full-horizontal conductors (e.g., those that can receive inputs from the horizontal I/O pins) are programmably connectable to drive certain vertical conductors. These vertical conductors are programmably connectable to drive other horizontal conductors in other rows. This gives the device the ability to route any horizontal input to any logic region in the device.

Each output of each logic region is programmably connectable to a half-horizontal conductor adjacent to the region, to a full-horizontal conductor adjacent to the region, and to two vertical conductors adjacent to the region. In addition, regions in adjacent columns are paired so that each output of each logic region in such a pair can alternatively use the output connections (to the above-mentioned half-horizontal, full-horizontal, and vertical conductors) of the corresponding output of the other region in the pair. This gives each output of a region two different sets of conductor destinations, thereby increasing interconnection flexibility without increasing the number of conductors that must be provided. Because these conductors are connectable to input/output ("I/O") pins of the device, the number of I/O pins that each logic region output can reach is also doubled.

In the preferred embodiments each logic region includes several logic modules. Each logic module has several input signals and is programmable to produce a combinational signal which is a desired logical combination of the inputs. Each logic module also includes a register (e.g., a flip-flop). The combinational signal can be passed to the output of the logic module either directly or via the register. To make a register usable, even when it is not being used to register the combinational signal of the logic module, programmable switches are provided for allowing one of the logic module inputs to be applied to the register. Additional programmable switches are provided for allowing either the combinational signal (which is bypassing the register) or the register output signal to be applied to feedback circuits within the logic region. These additional switches also allow the signal which is not being applied to these feedback circuits to be applied to the above-mentioned conductors that go beyond the region. In other words, either the combinatorial or registered output signal can be used for either local feedback or region output. This is a greater degree of flexibility in the simultaneous use of a combinational signal and a so-called "lonely register" signal than is possible in the known prior devices.

Another feature that may be provided in accordance with this invention is an input-pin-driven global clear function for resetting all registers in the device.

Circuitry is added to each logic module and to I/O registers to make it possible to do clock enables more efficiently. A clock enable now requires only two logic module inputs, and dedicated clock enables are provided in the peripheral I/O cell logic.

The I/O cells are enhanced to include the following features: (1) an open drain option, (2) clock enables (mentioned above), (3) a pin-controlled global output enable, and (4) dedicated clocks. Each I/O cell also has dedicated output enable circuitry which is controlled directly from the horizontal conductors for horizontal I/O pins or from the vertical conductors for vertical I/O pins.

It is known to provide carry chain connections from one logic module to another in a logic region and from one logic region to another. Such carry chain connections facilitate the performance of arithmetic functions such as adders and counters. In accordance with the present invention carry chain connections are not made between adjacent logic regions. Rather, the carry chain connection from each logic region skips the immediately adjacent logic region and goes to the next most nearly adjacent logic region. This spreads out an arithmetic chain to ease the fitting problems encountered, for example, by having a 16-bit counter all bunched together.

It is also known to provide cascade chain connections from one logic module to another in a logic region and from one logic region to another. Such cascade chain connections facilitate the performance of wide fan-in functions, for example. In accordance with this invention cascade chain connections are made in a similar fashion to carry chain connections. Thus cascade connections are not made between adjacent logic regions. Rather, the cascade connection from each logic region skips the immediately adjacent region and goes to the next most nearly adjacent logic region. This also eases fitting problems associated with wide fan-in functions.

So-called fast conductors are provided which extend to every logic region on the device. Such conductors are useful for purposes such as providing a global clock signal. To facilitate generation of a fast line signal by the device itself certain other conductors such as full-horizontal conductors are programmably connectable to the fast line conductors.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
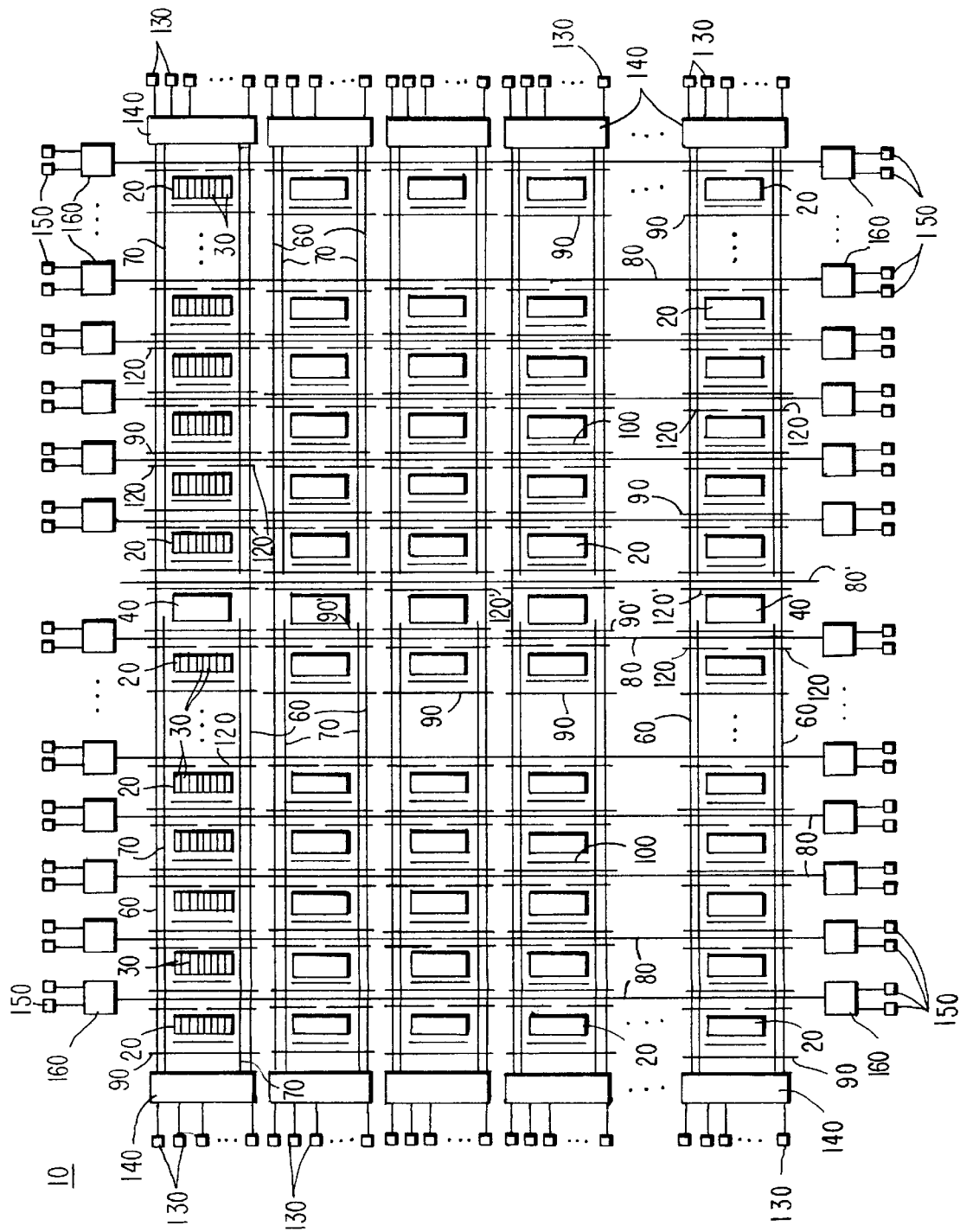
FIG. 1 is a simplified, partial, schematic block diagram of an illustrative programmable logic array device that can be constructed in accordance with the principles of this invention.

With reference to FIG. 1, illustrative programmable logic array integrated circuit device 10 has a plurality of regions 20 of programmable logic disposed on the device in a two-dimensional array of intersecting rows and columns of such regions. In the depicted preferred embodiment device 10 has ten rows of regions 20, 36 regular columns of regions 20, and two spare columns of regions 20. The spare columns (which are not shown in FIG. 1, but which are shown in part in FIG. 2) are used only when a regular column is found to be defective. The columns are divided into two groups: (1) 18 regular columns and one spare column to the left of a central column of random access memory ("RAM") regions 40, and (2) 18 regular columns and one spare column to the right of the central column of RAM regions 40. The spare column to the left of RAM regions 40 can only be used to compensate for a defective regular column to the left of regions 40. Similarly, the spare column to the right of RAM regions 40 can only be used to compensate for a defective regular column to the right of region 40.

Each region 20 includes a plurality of subregions or logic modules 30 of programmable logic. In the depicted preferred embodiment there are eight logic modules 30 in each region 20. To simplify FIG. 1 the subdivision of regions 20 into logic modules 30 is only shown in the first row of that FIG. Although logic modules 30 may be constructed in many other ways (e.g., as product-term-based macrocells), in the depicted preferred embodiment (see especially FIG. 3) each logic module includes a four-input look-up table or comparable universal logic block ("ULB") 32 and a flip-flop or register device 34. Each ULB 32 can be independently programmed to provide as an output signal any logical combination of four inputs 36 to the logic module 30 that includes that ULB. The output signal of the ULB can be registered by the associated flip-flop 34 and then made the output signal 38 of the logic module, or the output signal of the ULB can be applied directly to output 38 (i.e., without registration by the flip-flop). Each logic module 30 also has a cascade input 52 and a carry-in input 54 from an adjacent logic module, as well as a cascade output 52 and a carry-out output 54 to another adjacent logic module. These inputs 52/54 can be combined with or substituted for regular inputs 36 to facilitate provision of large fan-in functions or the performance of adder and counter functions. Suitable cascade circuitry is shown in more detail in Cliff et al. U.S. Pat. No. 5,258,668. Suitable carry circuitry is shown in more detail in Cliff et al. U.S. Pat. No. 5,274,581. (The cascade connection 52t from the row above is a special connection used for test purposes and is not germane to the present invention.)

Returning to FIG. 1, each row has two groups of horizontal interconnection conductors 60 that extend the entire length of the row, one group of conductors 60 being above the row and the other group being below the row. In the depicted preferred embodiment each of these groups includes 72 conductors. (In some other views, such as FIGS. 2 and 3, all of conductors 60 associated with a row are shown on one side of the row for greater simplicity.) Conductors 60 are sometimes referred to as full-horizontal conductors or as global horizontal conductors. Each conductor 60 preferably extends continuously or substantially continuously along the entire length of the associated row and is not made up of shorter conductor segments that are optionally programmably pieced together.

Each row also has four groups of horizontal interconnection conductors 70 that extend along half the length of the row. Two of these groups extend respectively along the top and bottom of the left half of the row. The other two groups of these conductors 70 extend respectively along the top and bottom of the right half of the row. In the depicted preferred embodiment each of these groups includes 36 conductors. (Again, in some other FIGS. all of the conductors 70 associated with the left or right half of a row are shown on one side of the row for greater simplicity.) The conductors 70 associated with each half of a row are preferably not directly connectable to the conductors 70 associated with the other half of the row. This characteristic of conductors 70 is sometimes referred to herein by saying that each conductor 70 is "separate" from all other conductors 70. Conductors 70 are sometimes referred to as half-horizontal conductors. Each conductor 70 preferably extends continuously or substantially continuously along the length of the associated half row and is not made up of shorter conductor segments that are optionally programmably pieced together.

Each column of regular logic regions 20 has a group of vertical interconnection conductors 80 that extend continuously or substantially continuously along the entire length of the column. In the depicted preferred embodiment each of these groups includes 24 conductors 80.

In order to feed logic signals to each region 20, each regular logic region has an associated plurality of region feeding conductors 90 that can bring signals to the logic region from the horizontal conductors 60 and 70 associated with that region. In the depicted preferred embodiment there are 22 region feeding conductors 90 associated with each regular logic region 20. The manner in which conductors 90 are programmably connectable to conductors 60, 70, and 36 (FIG. 3) will be discussed in detail below.

Each region 20 also has eight associated local feedback conductors 100. Each conductor 100 makes the output signal 38 (FIG. 3) of a respective one of the logic modules 30 in the associated region 20 available as an input to any of the logic modules in that region without having to use any interconnection resources that are not exclusively associated with the region.

Each region 20 also has output conductors 120 for conveying the output logic signals 38 (FIG. 3) of the logic modules 30 in that region to the associated conductors 60 and 70. Conductors 120 convey the output signals of the upper four logic modules 30 in a region 20 to the conductors 60 and 70 that are above the region. Other conductors 120 associated with the region convey the output signals of the lower four logic modules 30 in the region to the conductors 60 and 70 that are below the region. The manner in which conductors 120 are programmably connectable to conductors 60 and 70 is discussed in more detail below. The output signals 38 (FIG. 3) of each regular logic region 20 are also programmably connectable to the vertical conductors 80 associated with that region. This will also be discussed in more detail below.

Programmable logic connectors ("PLCs") (not shown in FIG. 1 but shown elsewhere such as at 242 in FIG. 3) are associated with each regular logic region 20 for making connections from the vertical (80) to the horizontal (60 and 70) conductors associated with the region. Other PLCs (not shown in FIG. 1 but shown elsewhere such as at 270 in FIG. 4) are associated with each regular logic region 20 for making connections from the horizontal (60) to the vertical (80) conductors associated with the region.

PLCs 242 and 270 (and other PLCs used throughout device 10) can be implemented in any of a wide variety of ways. For example, each PLC can be a relatively simple programmable connector such as a switch or a plurality of switches for connecting any one of several inputs to an output. Alternatively, each PLC can be a somewhat more complex element which is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. The components of PLCs can be controlled by various, programmable, function control elements ("FCEs"), which are not always shown separately in the accompanying drawings. (With certain PLC implementations (e.g., fuses and metal optional links) separate FCE devices are not required, so that in those cases any depiction of FCE devices in the accompanying drawings merely indicates that the PLCs are programmable.) FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like. Any of these technologies can also be used to implement the programmable memories of above-described ULBs 32. From the various examples mentioned above it will be seen that this invention is applicable both to one-time-only programmable and reprogrammable devices. However, for at least some features of the invention, the especially preferred embodiments tend to be reprogrammable because reprogrammable devices tend to benefit more from the economies of interconnection resources that result from the practice of this invention.

At each end of each row there are eight "horizontal" input/output pins 130. The input/output pins 130 associated with each end of each row are programmably connectable to the adjacent conductors 60 and 70 associated with that row via PLC networks 140. The construction of networks 140 is discussed in more detail below.

At the top and bottom of each column of regular logic regions 20 there are two "vertical" input/output pins 150. The input/output pins 150 associated with each end of each column are programmably connectable to the conductors 80 associated with that column via PLC networks 160. Networks 160 can be generally similar to networks 140.

As has been mentioned, at the center of each row, there is a region of RAM 40 that is programmable and usable by the user to store and output any desired data. Each RAM region 40 can receive data via a plurality of RAM feeding conductors 90'. In the depicted preferred embodiment there are 22 conductors 90' associated with each RAM region 40. Conductors 90' can receive signals from the conductors 60 and from the left half of the conductors 70 associated with the row that includes the RAM region served by those conductors 90'. The manner in which conductors 90' are programmably connectable to conductors 60 and 70 is discussed in more detail below.

Each RAM region 40 can output its data to an associated plurality of RAM output conductors 120' and also to a plurality of vertical interconnection conductors 80' that extend along the length of the column of RAM regions. Conductors 120' can be used to apply the associated RAM output signals to the conductors 60 associated with the row that includes the RAM region 40 producing those output signals. Conductors 80' can be used to convey the RAM output signals to other rows of the device. In the depicted preferred embodiments there are 24 conductors 80'.

Each RAM region 40 also includes PLCs (not shown in FIG. 1 but shown at 454 in FIG. 7) that can be used to connect conductors 80' to the conductors 60 associated with the row that includes that RAM region.

Figure 2:
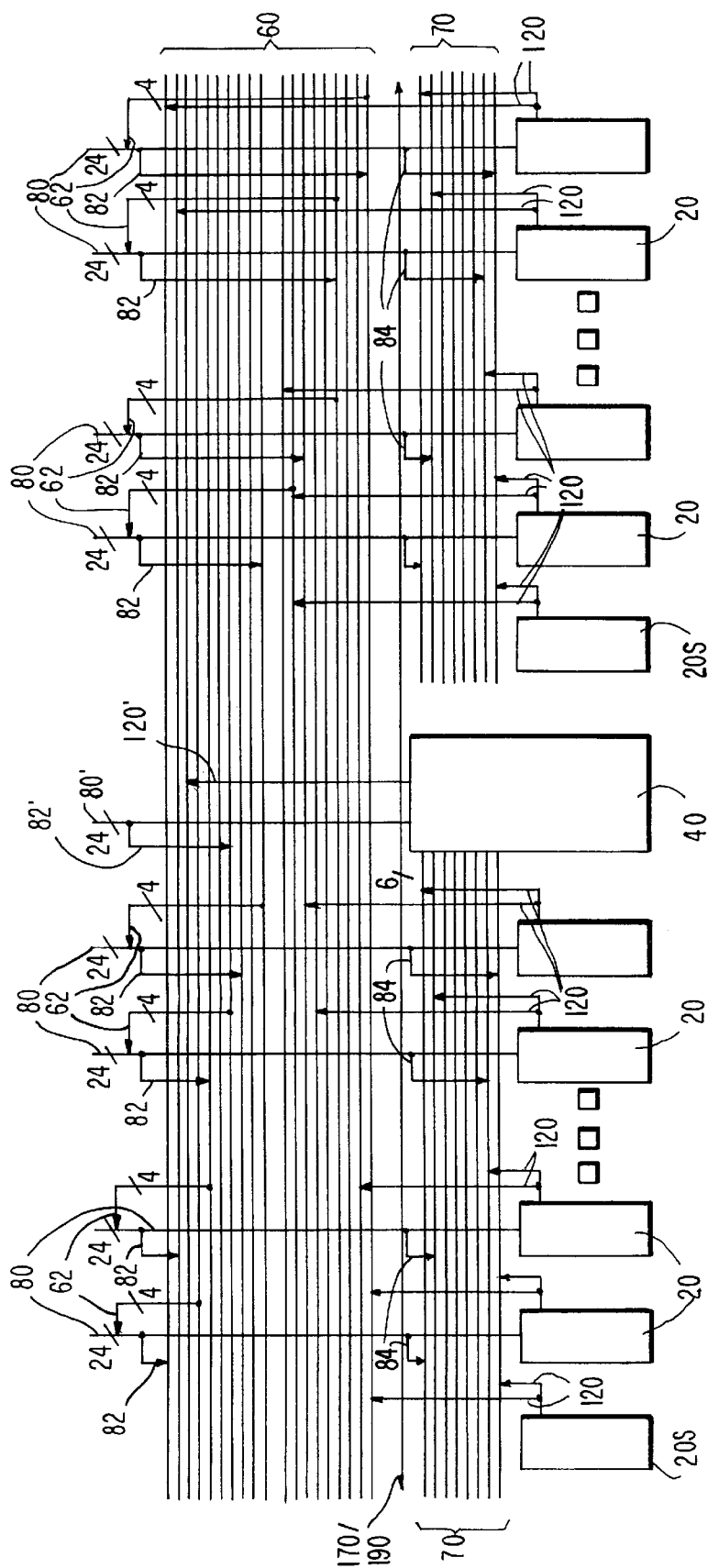
FIG. 2 is a more detailed, but still simplified, schematic block diagram of a representative portion of the apparatus of FIG. 1.
Figure 3:
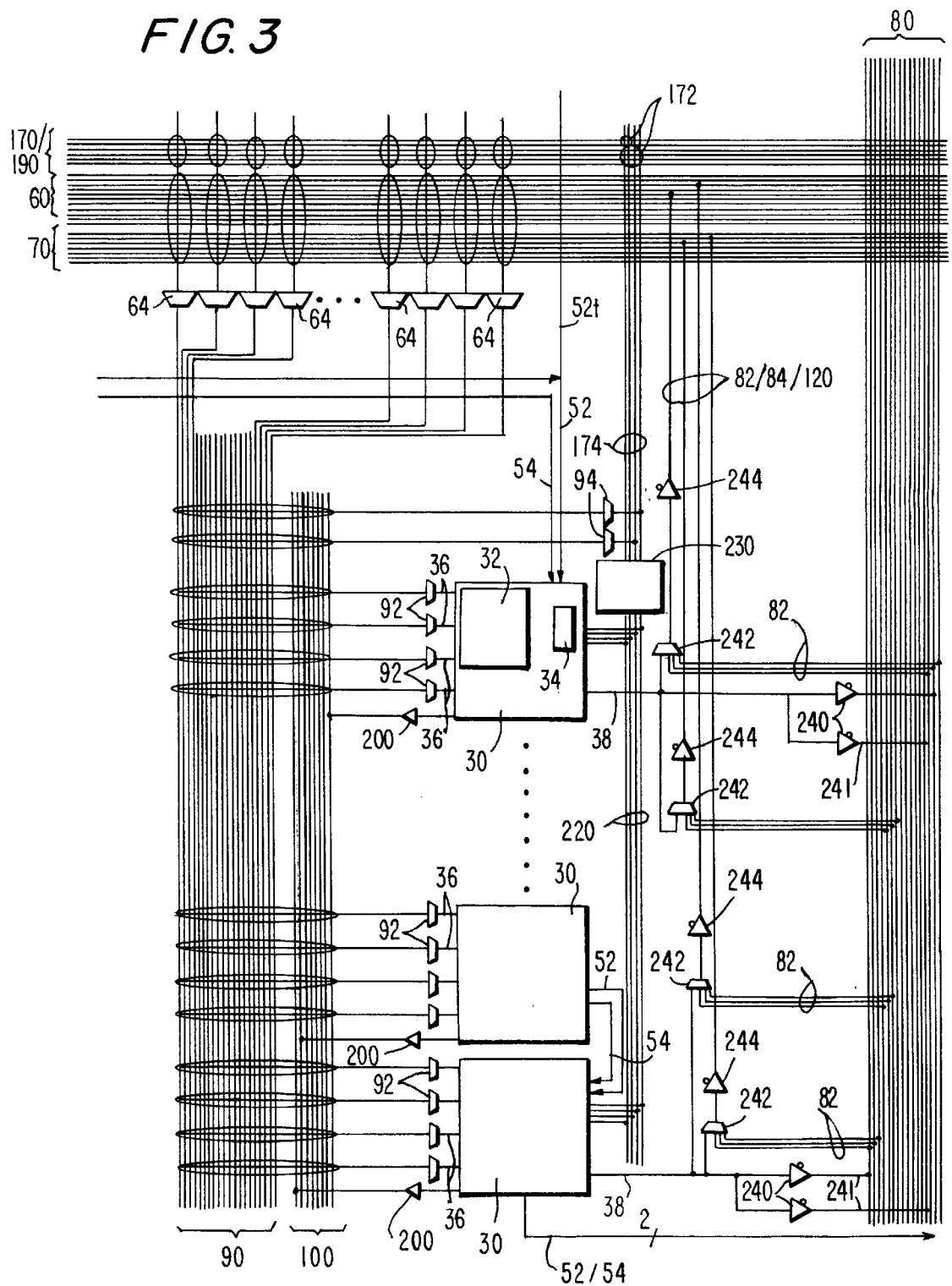
FIG. 3 is a still more detailed, but still simplified, schematic block diagram of a representative portion of the apparatus of FIG. 1.
Figure 6:
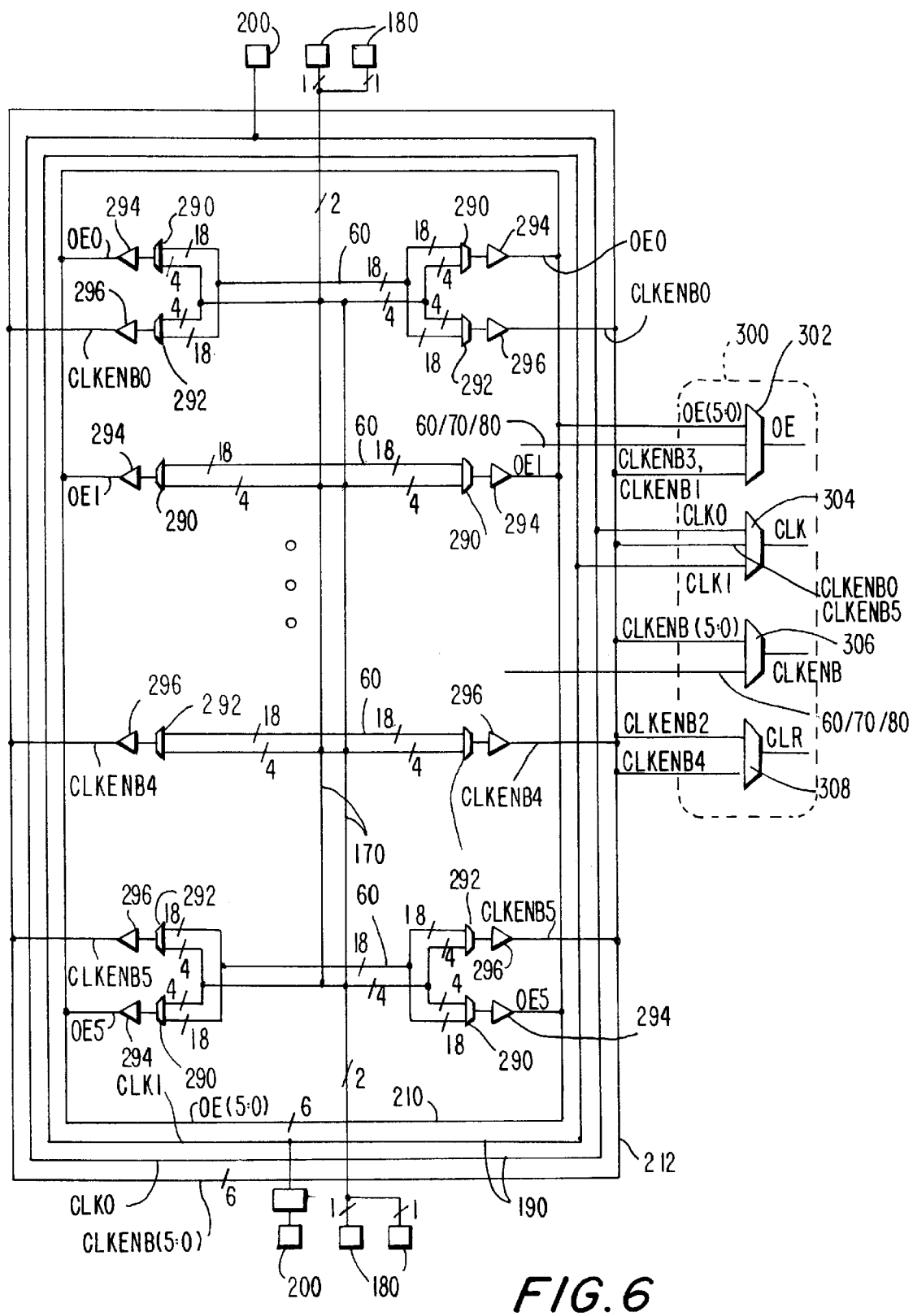
FIG. 6 is a simplified schematic block diagram of additional features of the apparatus of FIG. 1.

It will be apparent from the ensuing discussion that device 10 includes more circuitry than is shown in FIG. 1. For example, FIG. 6 shows that there are four so-called fast lines 170 that extend from four dedicated input pins 180 to the vicinity of every region 20 (see also FIGS. 2 and 3). FIG. 6 also shows that the device is ringed by a so-called peripheral bus that includes two clock signal conductors 190 (extending from two dedicated clock input terminals 200), six output enable signal conductors 210, and six clock enable signal conductors 212. FIGS. 2 and 3 show that the two clock signal conductors 190 (like fast conductors 170) extend to the vicinity of every region 20 on the device.

FIG. 2 illustrates some of the connections of a typical row in somewhat more detail than FIG. 1. It will be understood, however, that FIG. 2 tends to show only a few representative conductors of each type, or in some cases represents several conductors by a single line. FIG. 2 also shows the two spare logic regions (designated 20s) in a typical row.

FIG. 2 shows that there are several programmable connections 62 from the conductors 60 associated with each row to the conductors 80 associated with each column. In the depicted preferred embodiment there are four such programmable connections 62 from each row to each column. The connections 62 along each row are distributed over the conductors 60 associated with that row. Similarly, the connections 62 along each column are distributed over the conductors 80 associated with that column.

FIG. 2 also shows that there are programmable connections 82 from the conductors 80 associated with each column to the conductors 60 associated with each row, as well as programmable connections 84 from the conductors 80 associated with each column to the conductors 70 associated with each row. The connections 82 and 84 along each column are distributed over the conductors 80 associated with that column. Similarly, the connections 82 and 84 along each row are respectively distributed over the conductors 60 and 70 associated with that row.

FIG. 2 further shows that each logic module 30 in each region 20 in a row can drive one conductor 60 and one conductor 70 associated with the row that includes that region. This is done via programmable connections 120, which are, of course, also shown in FIG. 1 and partly described above. FIG. 2 shows that the connections 120 along a row are distributed over the conductors 60 and 70 associated with that row.

FIG. 2 still further shows that the left half of the conductors 70 associated with a row can supply inputs to the RAM region 40 associated with that row. (The conductors 60 associated with a row can also supply inputs to the RAM region 40 associated with that row, but this is better shown in FIG. 7.) Outputs of a RAM region can be applied to certain of the associated conductors 60 via programmable connections 120'. There are programmable connections 82' from conductors 80' associated with the RAM column to the conductors 60 associated with each row.

FIG. 2 also shows the availability of the four fast conductors 170 and the two dedicated clock conductors 190 adjacent each region 20 in a row.

FIG. 3 shows various aspects of a representative region 20 and associated apparatus in more detail. Each of the 22 region feeding conductors 90 associated with a region receives the output of a PLC 64 (a 21 to 1 multiplexer in the depicted, presently preferred embodiment) associated with that conductor 90. The 21 inputs to each PLC 64 associated with a region are different subsets of fast conductors 170, dedicated clock conductors 190, the conductors 60 associated with the row that includes the region, and the conductors 70 associated with the half row that includes the region. Thus the inputs to each PLC 64 are a partial population of the conductors 60, 70, 170, and 190 associated with the region. As a multiplexer, each of PLCs 64 is programmable to connect any one of its inputs to its output. This is similarly true of the other multiplexers mentioned throughout this specification.

The main output logic signal 38 of each logic module 30 in a region 20 is applied (via a feedback buffer 200) to a respective one of the local feedback conductors 100 associated with that region. As was mentioned in connection with FIG. 1, local feedback conductors 100 are associated with each region 20 to make the output of each logic module 30 in the region available as a possible input to any logic module in the region without having to use any of the more general interconnection resources of the chip to provide such local interconnectivity.

The signal on any of conductors 90 or 100 associated with a region 20 can be applied to any of the main inputs 36 of any logic module 30 in that region via a PLC 92 (a 30 to 1 multiplexer in the depicted, presently preferred embodiment) that is associated with that input 36. Thus the inputs to each PLC 92 are a full population of associated conductors 90 and 100.

Each logic module 30 in a region 20 can also receive any of several control signals via leads 220. The signals on these leads may be used by the logic module for such purposes as a clock signal for the flip-flop 34 of the logic module and/or a clear signal for the flip-flop of the logic module. Circles 172 in FIG. 3 represent fully populated PLCs for selectively bringing the signals on fast conductors 170 and dedicated clock conductors 190 into the region via leads 174 for possible use on leads 220 in that region. Certain of leads 174 can alternatively carry so-called asynchronous clock and/or clear signals derived from the conductors 90 and/or 100 associated with the region. PLCs 94 (similar in all respects to above-described PLCs 92) are provided to connect any of conductors 90 and 100 to selected leads 174 to make these asynchronous clock and/or clear signals available. Although two PLCs 94 are shown in FIG. 3, a larger number (such as four) is preferred.

The signals on leads 174 are applied to programmable inversion and buffering circuitry 230. This circuit buffers each applied signal, and may also invert any applied signal under programmable control. The output signals of circuit 230 are made available to each logic module 30 in the region via conductors 212.

The main output logic signal 38 of each logic module 30 in a region 20 can be applied (via programmably controlled tri-state drivers 240 and leads 241) to either or both of two conductors 80 associated with the column that includes that region. The output signal 38 of each logic module in a region can alternatively or additionally be applied (via PLCs 242 (multiplexers in the presently preferred embodiment) and programmably controlled tri-state drivers 244) to one of conductors 60 and/or to one of conductors 70 associated with that region. The other inputs to each of PLCs 242 (i.e., on the leads designated 82 or 84 in FIG. 3) are signals from several of the conductors 80 associated with the region. Thus any of PLCs 242 and drivers 244 can alternatively be used to apply a signal on a conductor 80 to a conductor 60 or 70 associated with the region. The inputs 82/84 from conductors 80 to PLCs 242 are distributed over conductors 80. Similarly, the outputs from drivers 240 are distributed over conductors 80, and the outputs from drivers 244 are distributed over conductors 60 and 70.

For simplicity FIGS. 1–3 all assume that the regions 20 in each column are uniquely associated with the conductors 80 adjacent to that column and with the elements 240, 242, and 244 adjacent to the regions in that column. In the preferred embodiment, however, the outputs 38 of the logic modules in each column can in fact be shifted to an adjacent column, if desired, for either of two distinct purposes. The first of these purposes is to use a spare column of regions 20s to make up for a defect in another regular column. The second of these purposes is to swap the outputs of two adjacent columns to increase the flexibility with which outputs 38 can be introduced to conductors 60, 70, and 80. Representative circuitry for performing these two different kinds of column shifts of logic module outputs is shown in FIG. 4.

Figure 4:
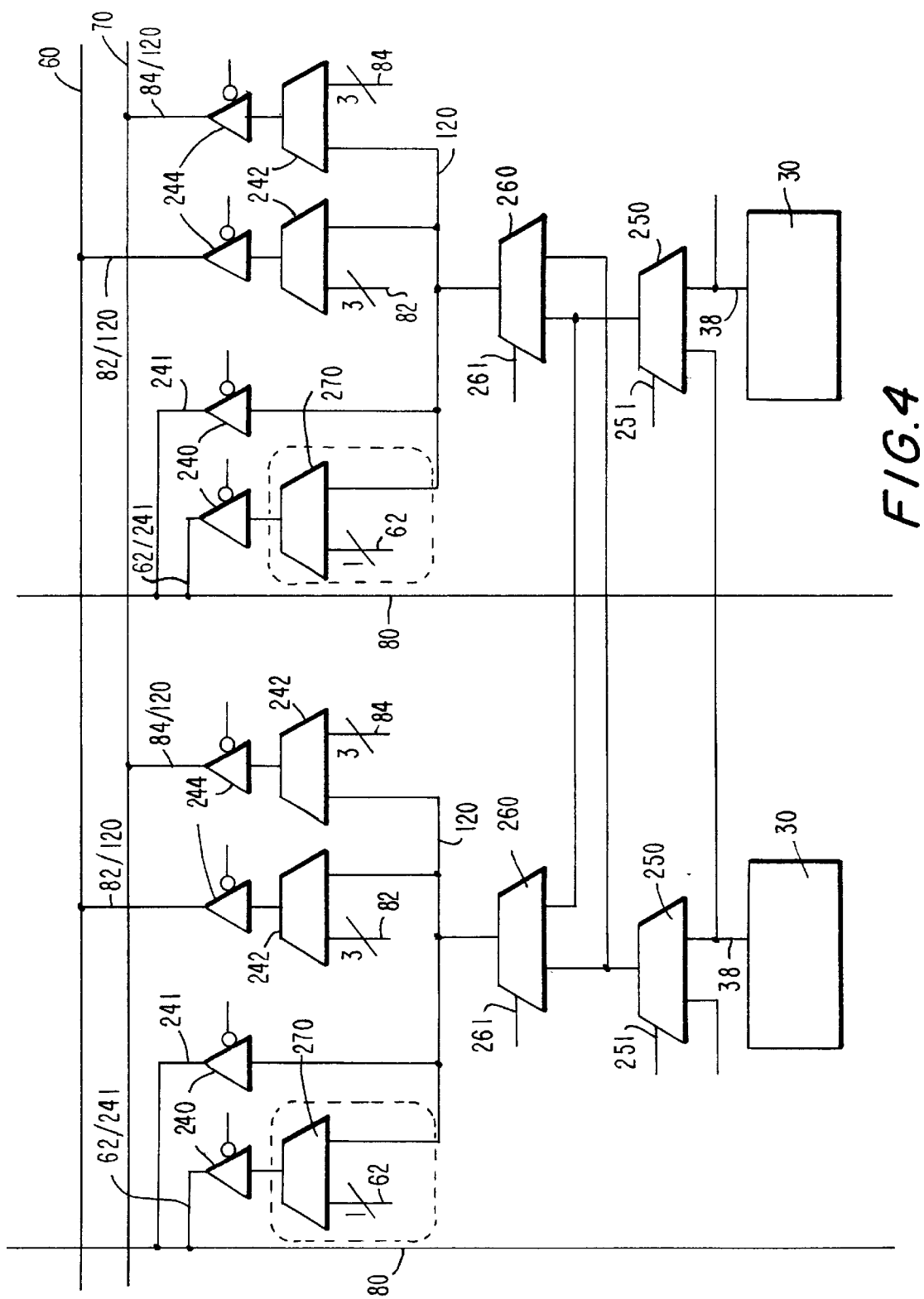
FIG. 4 is another more detailed, but still simplified, schematic block diagram of a representative portion of the apparatus of FIG. 1.

FIG. 4 shows one representative logic module 30 from each of two adjacent columns. These two logic modules are therefore horizontally adjacent to one another. The output 38 from the left-hand logic module is applied to one input of the redundancy PLC 250 (a multiplexer in the presently preferred embodiment) in the associated column, and also to one input of the similar redundancy PLC 250 in the column to the right. The other input to the PLC 250 in the left-hand column is a similar logic module output 38 from the column to the left of the columns shown in FIG. 4. The other input to the PLC 250 in the right-hand column is the output 38 from the depicted logic module in that column, and that logic module output is also applied to one input of the PLC 250 in the column to the right of the depicted columns. Each of PLCs 250 is controlled (via the associated control lead 251) by an associated FCE (a fuse in the presently preferred embodiment). PLCs 250 are controlled so that the logic module outputs 38 of a column containing a defect can be replaced by the outputs 38 of the column to the left of the defective column. The outputs of all columns to the left of a defective column are shifted right one column, and the spare column to the left of a defective column is put to use to make up for loss of the defective column. These column shifts are, however, confined to each of the two halves (left/right) of the device. In other words, there is no shifting from one side of the column of RAM regions 40 to the other side of that column.

The output of the redundancy PLCs 250 in the left-hand column in FIG. 4 is applied to one input terminal of the programmable swap PLC 260 (a multiplexer in the presently preferred embodiment) in that column and to one input terminal of the similar swap PLC 260 in the column to the right. The output of the redundancy PLC 250 in the right-hand column in FIG. 4 is applied to the other input terminal of the swap PLC 260 in the right-hand column, as well as to the other input terminal of the swap PLC 260 in the left-hand column. PLCs 260 are controlled via leads 261 by FCEs on device 10. It will therefore be apparent that the PLCs 260 in two adjacent columns that are paired by cross-connected PLC 250 outputs as shown in FIG. 4 allow the logic module outputs of those two columns to be swapped if desired. In particular, because the outputs of drivers 244 in the left-hand column in FIG. 4 are connected to different conductors 60 and 70 than the outputs of drivers 244 in the right-hand column, swap PLCs 260 double the choices available for connection of each logic module output signal 38 to conductors 60 and 70. Similarly, because the outputs of drivers 240 in the left-hand column in FIG. 4 are connected to different conductors 80 than drivers 240 in the right-hand column, swap PLCs 260 also double the choices available for connection of each logic module output signal 38 to conductors 80.

As a possible alternative to swap PLCs 260 in directly horizontally adjacent logic modules being paired as shown in FIG. 4, more mixing can be built into the swap PLC logic by having each swap PLC receive its second input from a first other logic module, while the primary input to that swap PLC is also directed (as a second input) to the swap PLC in a second other logic module. All of the swap PLC exchanges in this alternative are preferably between logic modules in horizontally adjacent blocks, but they are not all between directly horizontally adjacent logic modules.

It will be understood from FIG. 4 that although PLCs 250 and 260 are not shown in FIG. 3, they are in fact interposed between the logic module outputs 38 and elements 240 and 242 in FIG. 3.

FIG. 4 also shows more detail as to how connections 62 in FIG. 2 are implemented. Four of the eight logic modules 30 in each region 20 have an associated PLC 270 (a multiplexer in the presently preferred embodiment) as shown in FIG. 4. Thus there are four PLCs 270 associated with each region 20. Each PLC 270 allows either a logic module output signal 120 or the signal 62 on one of adjacent conductors 60 to be applied to the associated driver 240 and thereby to one of associated conductors 80.

Figure 5:
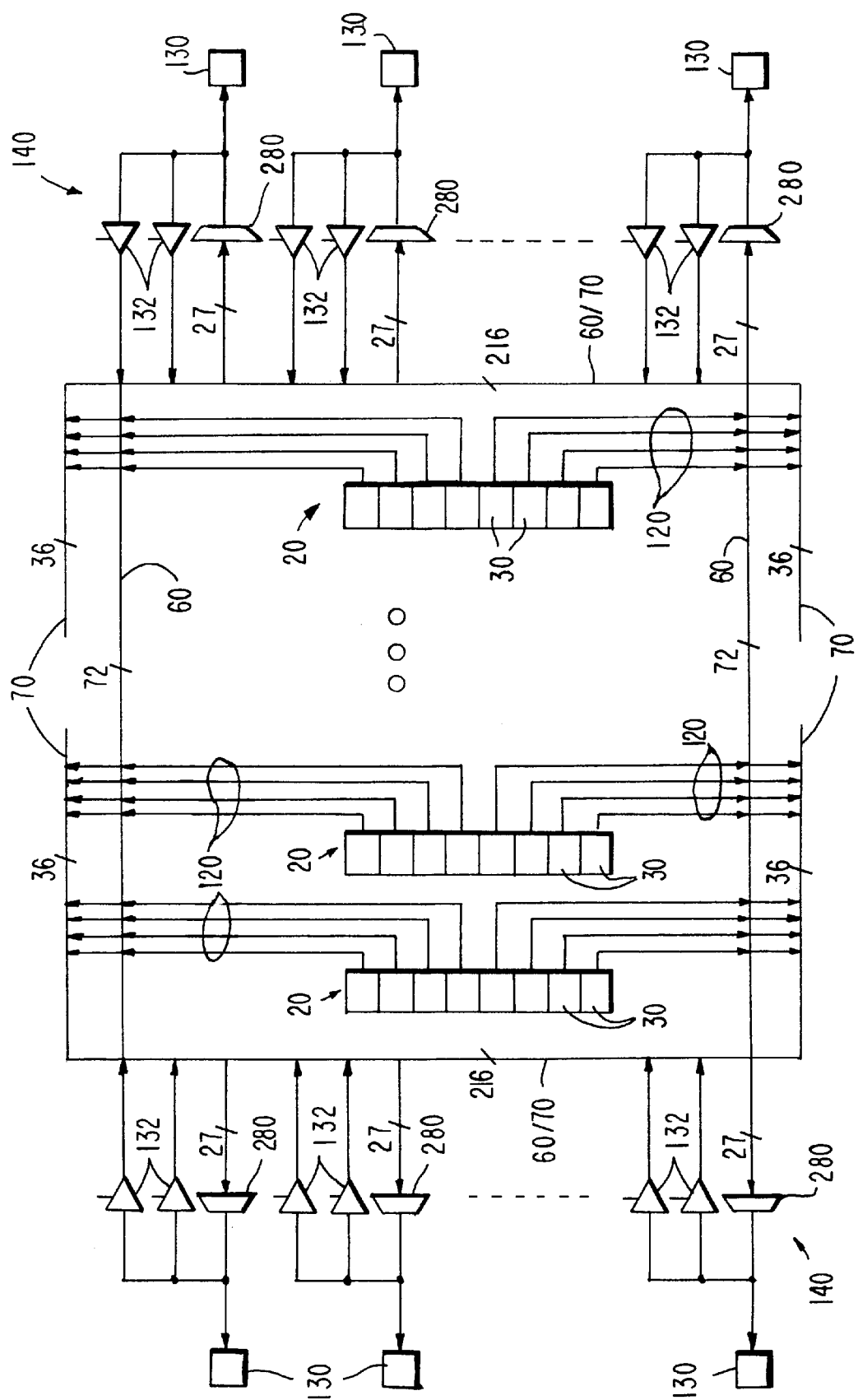
FIG. 5 is another more detailed, but still simplified, schematic block diagram of a representative portion of the apparatus of FIG. 1.

FIG. 5 shows some additional aspects of the connections to and from the conductors 60 and 70 for a typical row. As mentioned in connection with FIG. 1, each row has eight associated input/output pins 130 adjacent each end of the row. Also there are 144 conductors 60 and 72 conductors 70, for a total of 216 conductors 60/70 at each end of each row. (Each conductor 60, of course, appears at both ends of the associated row. Thus each conductor 60 is connectable to a pin 130 at either end of its row.) The conductors 60/70 at each end of a row are divided into eight different groups of 27 conductors each, and the conductors in each such group are applied to the 27 inputs of a respective one of PLCs 280 (27 to 1 multiplexers in the presently preferred embodiment). Each PLC 280 can select one of its inputs for application to an associated input/output pin 130 when that pin is to be used as a chip output.

For use of pins 130 as chip inputs, the signal on each pin 130 is applied to the inputs of two associated, programmable, tri-state drivers 132, the outputs of which are applied to different ones of conductors 60 in the row associated with that pin 130.

FIG. 5 also shows again that in each row half of the conductors 60 and 70 are above the logic regions 20 of that row, and the other half of conductors 60 and 70 are below those logic regions. And, as FIG. 5 shows, the upper four logic modules 30 in each region in a row supply their output signals 38 or 120 to the conductors 60/70 that are above the row, while the lower four logic modules in each region supply their output signals 38 or 120 to the conductors 60/70 that are below the row.

FIG. 6 has already been partly considered but will now be more fully discussed. As has been mentioned, there is a so-called peripheral bus that extends in a closed loop around the periphery of device 10. This peripheral bus includes the two dedicated clock signal conductors 190, six output enable conductors 210 (numbered 0 through 5, respectively), and six clock enable conductors 212 (numbered 0 through 5, respectively). Conductors 210 and 212 can be driven by the conductors 60 associated with each row that are drivable by the top-most logic module 30 in each region 20 in that row. Numbering the rows 0 through 9 from top to bottom, the following table shows the peripheral bus signals that are derivable from each row (where OE stands for output enable and CLKENB stands for clock enable):

TABLE 1

| Row Number | Peripheral Bus Signal(s) |
|---|---|
| 0 | OE0 |
|   | CLKENB0 |
| 1 | OE1 |
| 2 | CLKENB1 |
| 3 | OE2 |
| 4 | CLKENB2 |
| 5 | OE3 |
| 6 | CLKENB3 |
| 7 | OE4 |
| 8 | CLKENB4 |
| 9 | CLKENB5 |
|   | OE5 |

FIG. 6 shows the circuitry associated with representative rows for deriving the output enable and clock enable signals as in the foregoing table. This circuitry is exactly duplicated at both ends of each row to reduce signal propagation delay to and on the peripheral bus. Only one end of each row needs to be actually considered in connection with the following discussion.

Considering first the top-most row (row 0 in Table 1), the 18 conductors 60 that can receive output signals from the top logic module 30 of each region in the row are applied to PLCs 290 and 292 (22 to 1 multiplexers in the presently preferred embodiment) associated with that row. The four fast conductors 170 are also applied to those PLCs. PLCs 290 select one of their inputs as the OE0 signal and apply that signal (via drivers 294) to OE0 peripheral bus conductor 210. PLCs 292 similarly select one of their inputs as the CLKENB0 signal and apply that signal (via drivers 296) to the CLKENB0 peripheral bus conductor 212.

In the second row the 18 conductors 60 that can receive the output signal of the top-most logic module 30 of each region in the row are connected to PLCs 290. The four fast conductors 170 are also connected to those PLCs. PLCs 290 select one of the applied signals for application (via drivers 294) to the OE1 peripheral bus conductor 210.

The next to last row shown in FIG. 6 is row 8. The PLCs 292 in that row receive the 18 conductors 60 that can carry the top-most logic module output signals of that row and the four fast conductors 170. PLCs 292 select one of these inputs as the CLKENB4 signal, which is applied via drivers 296 to the appropriate peripheral bus conductor 212.

The bottom row shown in FIG. 6 is row 9. It is similar to the top row (row 0), except that the output of PLCs 290 is the OE5 signal and the output of PLCs 292 is the CLKENB5 signal.

Figure 9:
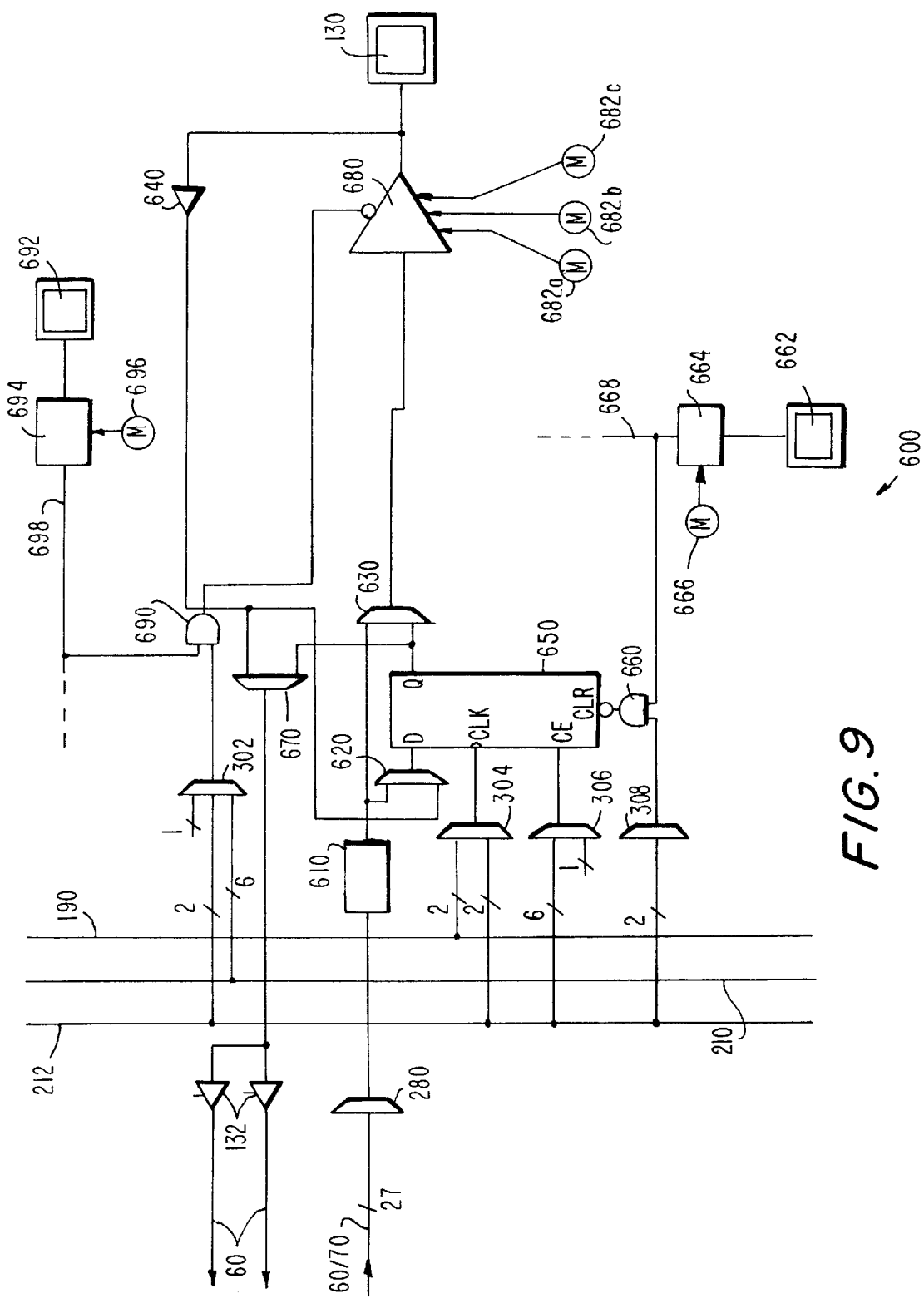
FIG. 9 is a more detailed, but still simplified, schematic block diagram of a portion of the circuitry shown in FIG. 5.

FIG. 6 also shows how the various peripheral bus signals are used in input/output cells associated with input/output pins 130 and 150. Representative circuitry 300 for generating an output enable signal, a clock signal, a clock enable signal, and a clear signal used in an input/output cell associated with an input/output pin 130 or 150 is shown in FIG. 6. (Each input/output pin 130 and 150 has an associated input/output cell 600, a representative one of which is shown in FIG. 9 and described in detail below. Each input/output cell 600 has associated circuitry 300 as shown in FIG. 6 (and repeated in FIG. 9).) PLC 302 (a 9 to 1 multiplexer in the presently preferred embodiment) receives the six output enable signals from conductors 210, one signal from a conductor 60 or 70 from the row associated with the pin 130 served by that circuitry 300 (or from a conductor 80 from the column associated with the pin 150 served by that circuitry 300), and the CLKENB0 and CLKENB1 signals from conductors 212. PLC 302 selects one of these nine inputs as the output enable signal of the associated input/output cell 600. Because one of the inputs to each PLC 302 is a conductor 60, 70, or 80 associated with the row or column that the associated input/output pin 130 or 150 is associated with, each input/output pin 130 and 150 can have its own unique output enable signal. PLC 304 (a 4 to 1 multiplexer in the presently preferred embodiment) receives the CLK0 and CLK1 signals from conductors 190, and the CKLENB0 and CLKENB5 signals from conductors 212. PLC 304 selects one of these signals as the clock signal of circuitry 300. PLC 306 (a 7 to 1 multiplexer in the presently preferred embodiment) receives the six clock enable signals from conductors 212 and one signal from a conductor 60/70 or a conductor 80, depending on whether circuitry 300 serves a pin 130 or a pin 150. PLC 306 can select one of its inputs as the clock enable signal of circuitry 300. Again, because one of the inputs to each PLC 306 is a conductor 60, 70, or 80 associated with the row or column that the associated input/output pin 130 or 150 is associated with, each input/output pin 130 and 150 can have its own unique clock enable signal. Lastly, PLC 308 (a 2 to 1 multiplexer in the presently preferred embodiment) receives the CLKENB2 and CLKENB4 signals from conductors 212, and can select either of these two signals as the clear signal of circuitry 300.

Figure 7:
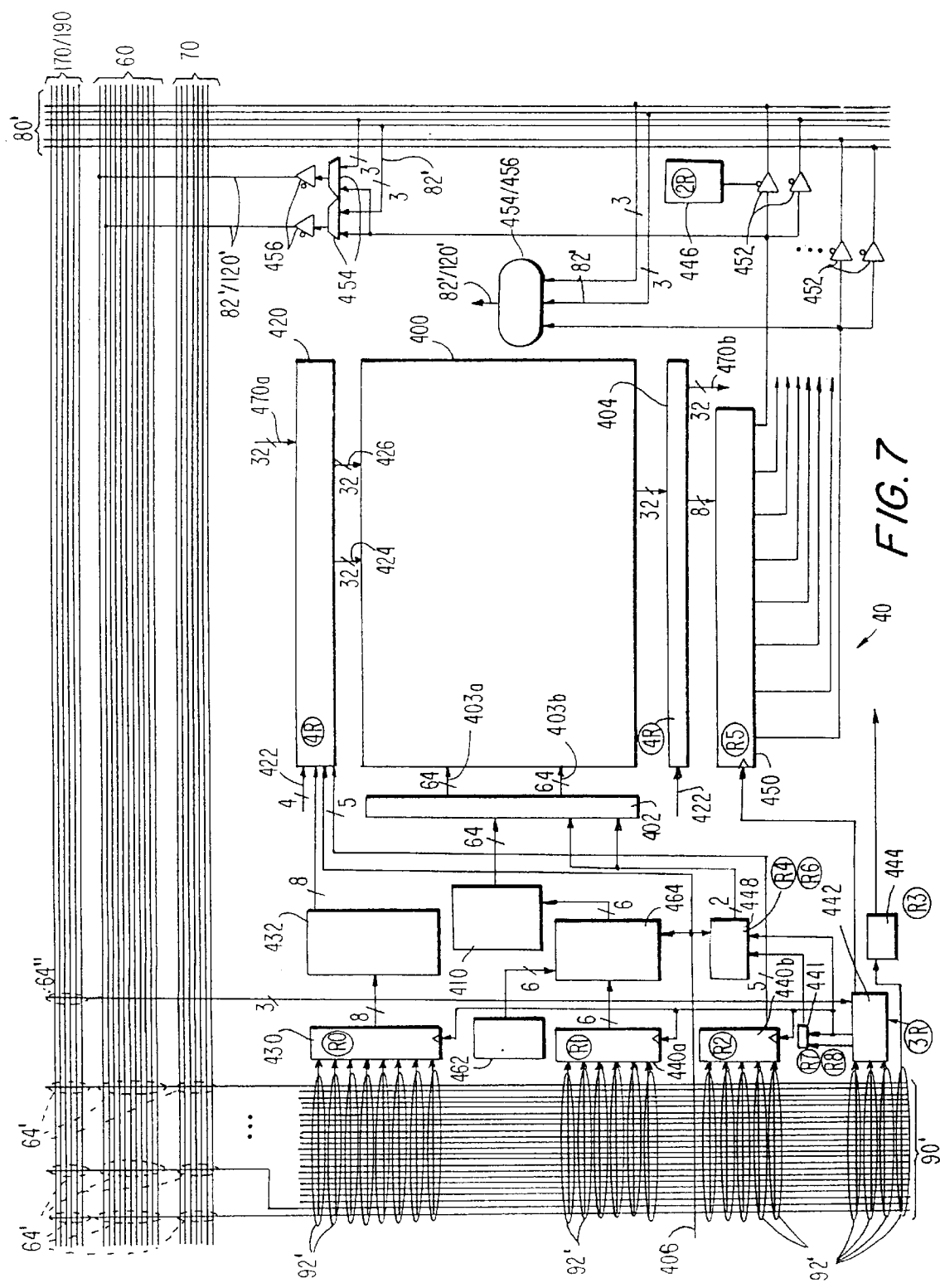
FIG. 7 is another more detailed, but still simplified, schematic block diagram of a representative portion of the apparatus of FIG. 1.

FIG. 7 shows a typical RAM region 40 in more detail, there being one such RAM region associated with each row. Each RAM region 40 includes 2048 bits of random access memory. These RAM bits are organized in a 64×32 array 400, which can be reconfigured as a 256×8, 512×4, 1024×2, or 2048×1 memory. Array 400 can be used as a static random access memory (SRAM) or as a read-only memory (ROM). Each memory cell (which can be implemented as described above for FCEs) can be accessed through a row decoder 410 and a column decoder 420. The RAM region 40 needs a maximum of 11 address signals, eight data signals, a read-write control signal, two clock signals, and an output enable signal in order to operate.

The interface of RAM region 40 to the remainder of the chip is very similar to the interface for a regular logic region 20. RAM region 40 has 22 region feeding conductors 90' for bringing signals into the region from the row conductors 60 associated with the row that includes the RAM region and also from the half-row conductors 70 associated with left half of that row. Each of these conductors 60 and 70 has four chances to route into the RAM region via PLCs 64' (as compared to two chances in a regular logic region 20). PLCs 64' also allow fast conductors 170 and dedicated clock conductors 190 to feed conductors 90'. The input PLCs 92' to the RAM region are fully populated. The clock and read-write control signals (applied to programmable clock and read-write control circuit 442) can be generated either from the conductors 90' or more directly from conductors 170 and 190 via PLCs 64". Control circuit 442 makes this selection, and is also programmable to invert any of the selected signals. The read-write control signal output by circuit 442 is applied to read/write control block 448 via register/bypass circuit 441. Circuit 441 is programmable to either register the read-write control signal or to pass that signal through without registration. The "input" clock signal output by circuit 442 is applied to the clock input terminals of registers 430, 440a, 440b, 441, and 448. The "output" clock signal output by circuit 442 is applied to register 450. The "output" clock signal can be the same as the "input" clock signal, or it can be independent of the "input" clock signal. The output enable signal is applied to tri-state control logic elements 446 via register/bypass circuit 444 to possibly control elements 446 as is more fully described below. Circuit 444 is programmable to either register the output enable signal or to pass that signal through without registration.

RAM region 40 can be programmed to operate either in synchronous or asynchronous mode. In synchronous mode all data lines, address lines, and RAM outputs are registered by data register 430, address registers 440a/b, and RAM output register 450, respectively. Thus each of registers 430, 440a, 440b, and 450 is programmable to either register the applied signals or to pass those signals through unregistered.

Register 430 receives as many as eight data signals from associated PLCs 92'. The data output signals of register 430 are buffered by buffers 432 and applied to column decoder and data selection and control logic 420. Control logic 420 also receives via leads 422 the outputs of four FCEs which control whether RAM region 40 will function as an eight-bit-wide, four-bit wide, two-bit-wide, or one-bit-wide memory. (These four signals 422 are also applied to RAM data output selection circuit 404.) Control logic 420 also receives a programming mode control signal via lead 406, and the five most significant address bits from register 440b. (For use during programming mode operation of the device, control logic 420 also receives 32 programming data input signals via leads 470a as will be described in more detail below.) Control logic 420 produces on leads 424 address signals and on leads 426 data signals appropriate to the storage in RAM array 400 of one, two, four, or eight bits of data, depending on the memory configuration selected by the signals on leads 422.

Register 440a receives the six least significant address bits from associated PLCs 92'. The output signals of register 440a are applied to address control block 464. Control block 464 also receives six output signals from preload down counter 462, which is usable during programming mode to supply sequential RAM addresses to facilitate storage in the RAM of data that will subsequently be ROM data. Control block 464 selects one of the two groups of six inputs it receives, depending on whether the device is in programming mode as indicated by the signal on above-mentioned lead 406. The six outputs of control block 464 are applied to row decoder 410, which produces one of 64 outputs applied to address multiplexing circuit 402. Circuit 402 makes a one-of-64 selection to select one of the 64 rows of RAM array 400 that is to receive or output data.

Register 440b receives the five most significant address bits from associated PLCs 92'. As has been mentioned, the five address bits received by register 440b are applied to column decoder and data selection and control logic 420 for use in selecting the column or columns in RAM array 400 that is or are to receive or output data. The write enable signal is applied from register/bypass circuit 441 to programmable read/write control block 448, which produces read enable and write enable signals that are applied to address multiplexing circuit 402. Circuit 402 applies to RAM array 400 one of 64 read address signals 403a or one of 64 write address signals 403b, depending on whether reading or writing is enabled.

As has been said, RAM region 40 has 11 address lines, eight data lines, a read-write control line, two clock lines, and an output enable line. RAM array 400 can be configured as a 2K×1, 1K×2, 512×4, or 256×8 memory. There are four FCEs 422 to control these different configurations. The following table lists the address lines and data lines required under the four conditions identified above:

TABLE 2

|  | 2Kx1 | 1Kx2 | 512x4 | 256x8 |
|---|---|---|---|---|
| Address lines | 11 | 10 | 9 | 8 |
| Data lines | 1 | 2 | 4 | 8 |
| Read-Write Control | 1 | 1 | 1 | 1 |
| Clocks and Output Enable | 3 | 3 | 3 | 3 |
| Total | 16 | 16 | 17 | 20 |

If the "by 8" mode is selected (right-most column in Table 2), the three most significant address lines are automatically tied high. If the "by 4" mode is selected (next-to-right-most column in Table 2), the two most significant address lines are automatically tied high. If the "by 2" mode is selected (next-to-left-most column in Table 2), the most significant address line is automatically tied high.

RAM data output selection circuit 404 has 32 inputs, one from each column of RAM array 400. Circuit 404 also receives the four control inputs 422 described above. During normal operation of the device (as distinguished from programming mode operation) circuit 404 applies the data it receives from RAM array 400 to RAM output register 450 in a format determined by inputs 422 (i.e., a one-bit, two-bit, four-bit, or eight-bit format). Register 450 outputs the data it receives in the same format. (During programming mode operation circuit 404 simply passes its 32 inputs through to its 32 outputs 470b.)

To increase the depth or width of the RAM memory, the RAM regions 40 in two or more rows can be cascaded together. For example, to provide a 2K×8 memory, eight 2K×1 blocks can be used in parallel. This means using the RAM regions 40 in eight rows. Each row would contain a one-bit slice or byte of the eight-bit word, and the data from the eight rows would collectively provide the eight-bit word. Alternatively, a 256×8 configuration can be chosen for each of eight rows. Each row would produce an eight-bit byte or word which could be multiplexed with eight-bit bytes or words from the other rows. The multiplexing would be done in logic regions 20, and the high order RAM region address bits would control the multiplexing. Using all ten rows of RAM regions 40, the maximum memory depth possible is 20K (in a 20K×1 memory), and the maximum width possible is 80 bits (in a 256×80 memory). The following table lists some of the possible combinations with the different building blocks:

TABLE 3

2Kx1 as building block:
    2Kx1, 2Kx2, 2Kx3, . . ., or 2Kx10;
    4Kx1, 6Kx1, 8Kx1, . . ., or 20Kx1
1Kx2 as building block:
    1Kx2, 1Kx4, 1Kx6, . . ., or 1Kx20;
    2Kx2, 3Kx2, 4Kx2, . . ., or 10Kx2;
512x4 as building block:
    512x4, 512x8, 512x12, . . ., or 512x40;
    1Kx4, 1.5Kx4, 2Kx4, . . ., or 5Kx4
256x8 as building block:
    256x8, 256x16, 256x24, . . ., or 256x80;
    512x8, 768x8, 1Kx8, . . ., or 2.5Kx8

Returning to the discussion of synchronous vs. asynchronous mode, the selection of synchronous mode is controlled by the read-write control signal. If the read-write control signal is registered by circuit 441, then the RAM region is in synchronous mode. In synchronous mode the RAM region supports multiple read/write with continuous clock. For write operation the read-write control signal is held low, a new address is decoded during "input" clock high time (from circuit 442), and data is written into the RAM cells during the "input" clock low time. For read operation, the read-write control signal is held high, the data is read out on the rising edge of the "output" clock signal (from circuit 442) if the output is registered, or the data is read out directly if the output is bypassed. Thus, like registers 430, 440, and other similar elements, register 450 has selectable bypass capability.

In asynchronous mode the read-write control register 441 is bypassed and the "input" clock from circuit 442 is not used. The writing and reading of data into the RAM cells is controlled purely by the read-write control signal. During the write cycle the read-write control signal is held low and the RAM cells addressed will be written. The address signals are not allowed to change when the read-write control signal is low. During the read cycle, the read-write control signal is held high and the contents of the RAM cell addressed is read out. The address signals can be changed only when the read-write control signal is high.

As has been mentioned, RAM regions 40 can be operated as either an SRAM array which can be written to and read from dynamically, or as a ROM array with read-only access. Each RAM cell can be accessed through row decoder 410 and column decoder 420. Row decoder 410 takes the six least significant address bits from 11 address bits, and column decoder 420 takes the five most significant bits from the 11 address bits. To write data into the RAM cell synchronously the read-write control signal is held low and on the falling edge clock the data will be written into the addressed RAM cell. To read data out of the RAM cell synchronously the read-write control signal is held high and on the rising edge of the clock the data is read out of the addressed RAM cell. In asynchronous mode read-write control signal register 441 is bypassed. The writing and reading of data into the RAM cells is controlled by the read-write control signal only. When the read-write control signal is low, the location addressed by the address lines is written to. Data is read out of the addressed locations when the read-write control signal is held high.

To use the RAM regions as a ROM, data is written into the memory cells during programming of the chip. During programming, six-bit preload down counter 462 counts down sequentially from 3F (hexadecimal) to 00

(hexadecimal). The six outputs of counter 462 are fed to row decoder 410 to generate the row address while all column decoder 420 outputs are held high so that the 64×32 array 400 is programmed like a first-in-first-out (FIFO) chain. The programming data is supplied via 32 programming data leads 470a which come from the RAM region 40 of the preceding row. The chain of programming data leads continues via leads 470b to the RAM region 40 in the next row. After programming, the RAM regions act like a ROM if the read-write control signal is held permanently high to force the memory into read mode only.

There are 24 vertical conductors 80' associated with the column of RAM regions 40. Each RAM region 40 has 16 tri-state drivers 452 for selectively driving various ones of these vertical conductors 80'. Thus each RAM region output (from register 450) can drive either or both of two of vertical conductors 80'. Each driver 452 is controlled by associated tri-state control logic 446. Each of circuits 446 is controlled in turn by the user tri-state output enable signal from element 444 and two other programmable bits. Each driver 452 has three states: always on, always off, and tri-state. The user tri-state control has been provided as a means of having multiple blocks of RAM driving the same set of conductors 80'. This can be used for building "ping-ponging" type RAM, where one block outputs its data and then is switched off so another block can be switched on and output its data onto the same conductors 80'.

There are also 16 programmable tri-state drivers 456 associated with each RAM region 40 for selectively applying the RAM output signals to the horizontal conductors 60 associated with the row that includes that RAM region. Thus each RAM output can be applied to either or both of two conductors 60. (These are the programmable connections identified as 120' in other FIGS. such as FIG. 2.) Each driver 456 can alternatively be used to apply the signal on any of three conductors 80' to the conductor 60 driven by that driver. (These are the programmable connections identified as 82' in other FIGS. such as FIG. 2.) PLCs 454 (multiplexers in the presently preferred embodiment) select which signal the associated driver 456 will apply to the driven conductor 60.

Figure 8:
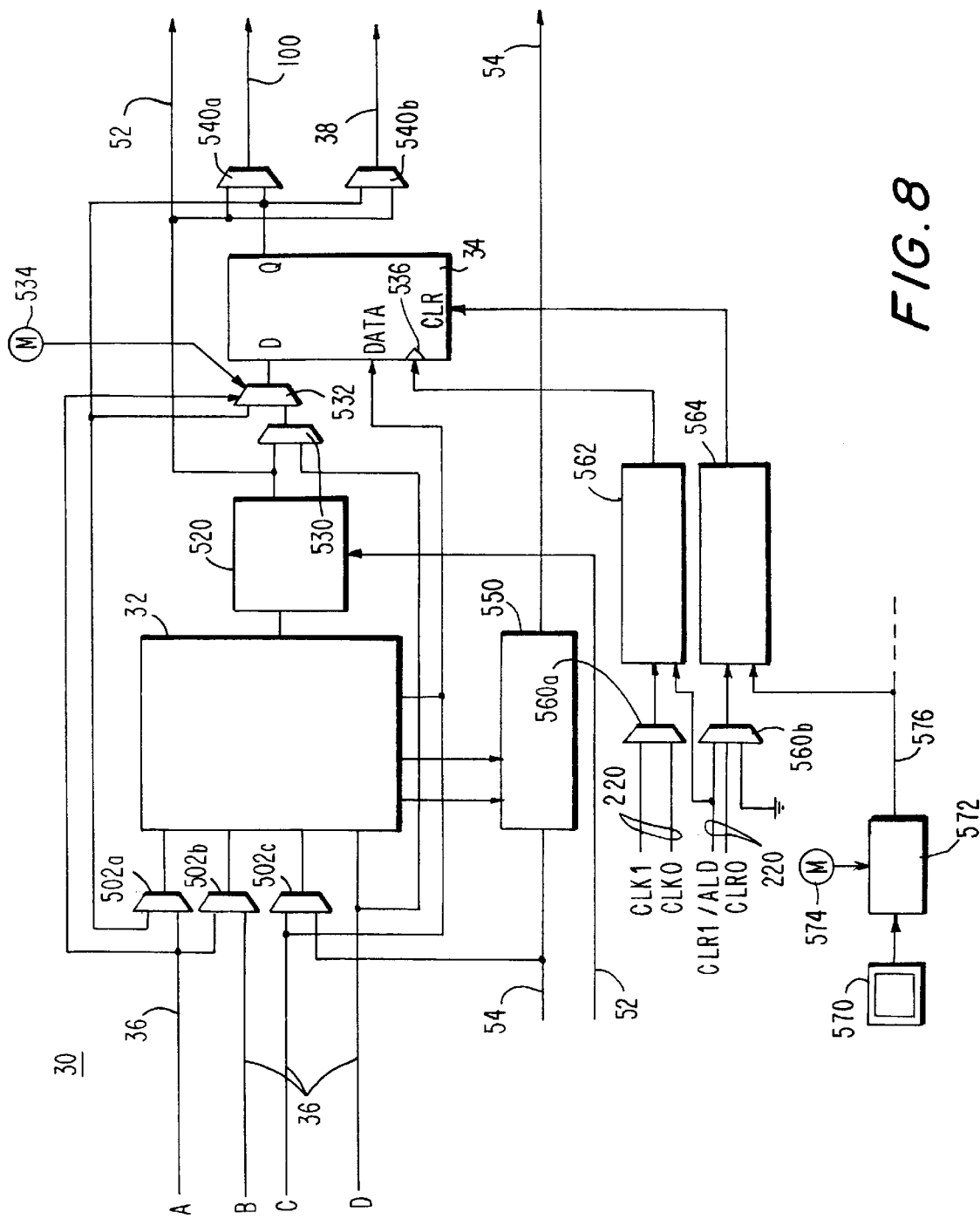
FIG. 8 is a more detailed, but still simplified, schematic block diagram of a portion of the circuitry shown in FIG. 3.

FIG. 8 shows an illustrative logic module 30 in more detail. The four primary inputs 36 to the logic module are respectively designated A–D. Input A is applied to one input terminal of each of PLCs 502a and 502b, as well as to a control input terminal of PLC 532. PLC 532 can be enabled to respond to input A by suitably programming FCE 534. If FCE 534 is not programmed to cause PLC 532 to respond to input A, then PLC 532 always applies the output signal of PLC 530 to the D data input terminal of flip-flop or register circuit 34. On the other hand, if FCE 534 is programmed to cause PLC 532 to respond to input A, then the state of input A determines whether PLC 532 connects the output of PLC 530 or the Q output of flip-flop 34 to the D input terminal of the flip-flop. If the output of the flip-flop is connected to its D input terminal, the flip-flop is rendered unable to take in any new data in response to clock pulses applied to its clock input terminal 536. Input A can thereby be made to be a clock enable signal for logic module register 34.

Returning to PLCs 502a and 502b, the other input to PLC 502a is the Q output of flip-flop 34. This circuit path is useful when the logic module is to be used as a counter stage. This (and several other attributes of logic module 30 which were known before) is explained in more detail, for example, in Cliff et al. U.S. Pat. Nos. 5,258,668 and 5,274,581. Input B is applied to the other input to PLC 502b. Input C is applied to one input of PLC 502c, and also to the "Data" input terminal of flip-flop 34. This latter circuit path can be used to load data directly into flip-flop 34, for example, when logic module 30 is part of a loadable counter.

Input D is applied to ULB 32, and is also applied to one input of PLC 530. The other input to PLC 530 is the output of cascade connect circuit 520. Cascade connect circuit 520 receives the primary output of ULB 32 and the cascade input 52 from another logic module, and can form and output a logical combination of those two inputs if cascading of logic modules is desired. (See Cliff et al. U.S. Pat. No. 5,258,668 for more details regarding cascade connection of logic modules.) If cascading is not being done, circuit 520 merely passes the primary output of ULB 32 to its output. In addition to being applied to one of the inputs of PLC 530, the output of circuit 520 is also applied to cascade output 52 and to one input of each of PLCs 540a and 540b. This latter circuit path allows the output of circuit 520 to bypass flip-flop 34 if it is not desired for that output of the logic module to be registered by the flip-flop. The circuit path from input D through PLCs 530 and 532 to the D input of flip-flop 34 can then be used to allow the flip-flop to register input D. Thus both the combinatorial and register portions of the circuit can be used independently if desired, thereby increasing circuit component utilization. Combinatorial components 32 and 520 can be used on inputs A–C and 52 (and even input D if duplicate use of input D is desired), while register component 34 is used to register input D. Moreover, PLCs 540a and 540b (each of which can select as its output either the combinatorial output of circuit 520 or the registered output of flip-flop 34) allow either the registered or combinatorial output of the logic module to be applied to either the local feedback conductor 100 or the more global output 38 of the logic module. In other words, the local feedback signal 100 of the logic module can be either its registered or combinatorial output, and the more global output 38 can be independently chosen to be either the registered or combinatorial output.

FIG. 8 also shows the arithmetic carry logic 550 of logic module 30. (As mentioned above, the carry aspects of logic module 30 are shown and described in more detail in Cliff et al. U.S. Pat. No. 5,274,581.) The carry in signal 54 is applied to one input of PLC 502c and also to carry logic 550. Carry logic 550 also receives two intermediate output signals of ULB 32, and on the basis of its three inputs, carry logic 550 produces a carry out signal 54.

FIG. 8 still further shows the clock and clear circuitry for logic module 30. Two of conductors 220 (i.e., the CLK0 and CLK1 clock conductors) are connected to the inputs of PLC 560a. PLC 560a is programmed to select one of these clock signals for application to clock and asynchronous load control circuit 562. The other input to circuit 562 is the signal on the CLR1/ALD conductor 220. The output signal of circuit 562 is applied to the clock input terminal 536 of flip-flop 34 for clocking data into the flip-flop via its D input terminal or for asynchronously loading data into the flip-flop via the terminal connected directly to D input 36.

PLC 560b can connect CLR1/ALD conductor 220, CLR0 conductor 220, or ground to clear control circuit 564. The other input to circuit 564 comes from a universal reset conductor 576 which extends adjacent to all of the logic modules 30 in the device. The output signal of clear control circuit 564 is applied to the clear input terminal of flip-flop 34. If FCE 574 is programmed to select a global reset option, then PLC 572 is enabled to connect device input pin 570 (similar to any of pins 130 or 150) to universal reset conductor 576. The device input signal applied to input pin 570 can then be used to reset all of the flip-flops 34 in the device.

In the presently preferred embodiment all of elements 502, 530, 532, 540, and 560 are multiplexers.

FIG. 9 shows a typical input/output cell 600 associated with a horizontal input/output pin 130. Similar input/output cells are associated with vertical input/output pins 150. However, in those cells the global horizontal 60 or half-horizontal 70 inputs and outputs shown in FIG. 9 are replaced by global vertical inputs and outputs 80. The size of the PLCs corresponding to PLCs 280 is also less in those cells because there are fewer global vertical conductors 80 associated with each column than there are horizontal conductors 60/70 associated with each row.

FIG. 9 shows that the output of PLC 280 (a multiplexer in the presently preferred embodiment) is applied to programmable inverter circuit 610. Inverter 610 either inverts or does not invert the applied signal, depending on whether an inversion option is selected by programming an FCE for that option. The output of programmable inverter 610 is applied to one input of each of PLCs 620 and 630 (multiplexers in the presently preferred embodiment). The other input to PLC 620 is the output of TTL buffer 640 from I/O pad 130. Thus PLC 620 can be programmed to apply either a device output signal from PLC 280 or a device input signal from I/O pad 130 to the data input terminal of I/O cell flip-flop 650. The output of PLC 304 (a multiplexer in the presently preferred embodiment) is applied to the clock input terminal of flip-flop 650. The output of PLC 306 (a multiplexer in the presently preferred embodiment) is applied to the clock enable input terminal of flip-flop 650. (Flip-flop 650 can only take in new data via its data input terminal if its clock input is enabled by an appropriate signal applied to its clock enable input terminal.) The output signal of PLC 308 (a multiplexer in the presently preferred embodiment) is applied to the clear input terminal of flip-flop 650 via OR gate 660.

The data output of flip-flop 650 is applied to the second input terminal of PLC 630 and to one input terminal of PLC 670 (a multiplexer in the presently preferred embodiment). The other input to PLC 670 is the output signal of TTL buffer 640. The output signal of PLC 630 is applied to the data input terminal of tri-statable output driver 680. The signal applied to the control input terminal of driver 680 is the output signal of OR gate 690. One of the inputs to OR gate 690 is the output signal of PLC 302.

From the foregoing it will be seen that I/O cell 600 is programmable to allow flip-flop 650 to register either a device output signal passing through the cell from PLC 280 to I/O pad 130, or a device input signal passing through the cell from I/O pad 130 to drivers 132. Alternatively, I/O cell 600 is programmable to pass a signal of either of the foregoing types without registration by flip-flop 650.

To permit global clearing of the flip-flops 650 in all of cells 600, a global clear signal input pin 662 (similar to any of pins 130 or 150) is programmably selectively connectable to global clear conductor 668 via PLC 664. PLC 664 is controlled to make this connection by suitably programming option FCE 666. Global clear conductor 668 extends adjacent to all of cells 600 and is connected to a second input terminal of the OR gate 660 in each cell. In this way, if the global clear option is selected, a signal applied to input pin 662 can be used to simultaneously clear all of flip-flops 650 on device 10.

To permit global output enabling of drivers 680 in all of cells 600, a global output enable signal input pin 692 (similar to any of pins 130 or 150) is programmably selectively connectable to global output enable conductor 698 via PLC 694. PLC 694 is controlled to make this connection by suitably programming option FCE 696. Global output enable conductor 698 extends adjacent to all of cells 600 and is connected to a second input terminal of the OR gate 690 in each cell. In this way, if the global output enable option is selected, a signal applied to input pin 692 can be used to simultaneously enable all of devices 680 (assuming that those devices are otherwise programmed as described below to respond to an output enable control signal).

Each of devices 680 has several FCEs 682*a*, *b*, and *c* associated with it. FCE 682*a* is programmable to cause device 680 to produce either a slowed output or a fast output. This is useful to help stagger the outputs of the device to reduce noise and/or to adjust output signal timing. FCEs 682*b* and 682*c* are programmable to select various functions of device 680 as shown in the following table:

TABLE 4

| Bit 682b | Bit 682c | Buffer Function |
| --- | --- | --- |
| 0 | 0 | Input only |
| 0 | 1 | Tri-state output |
| 1 | 0 | Open drain |
| 1 | 1 | Output only |

When FCEs 682*b* and 682*c* are programmed as shown in the first line of this table, the associated I/O pad 130 is usable only as an input pin. When FCEs 682*b* and 682*c* are programmed as shown in the second line of this table, device 680 is controlled by the output signal of OR gate 690 to be either an enabled output driver or to present a high impedance to I/O pad 130, depending on the state of the output signal of OR gate 690. When FCEs 682*b* and 682*c* are programmed as shown in the third line of this table, device 680 provides an open drain connection to pin 130. When bits 682*b* and 682*c* are programmed as shown in the fourth line of the foregoing table, device 680 functions at all times as an output buffer.

Figure 10:
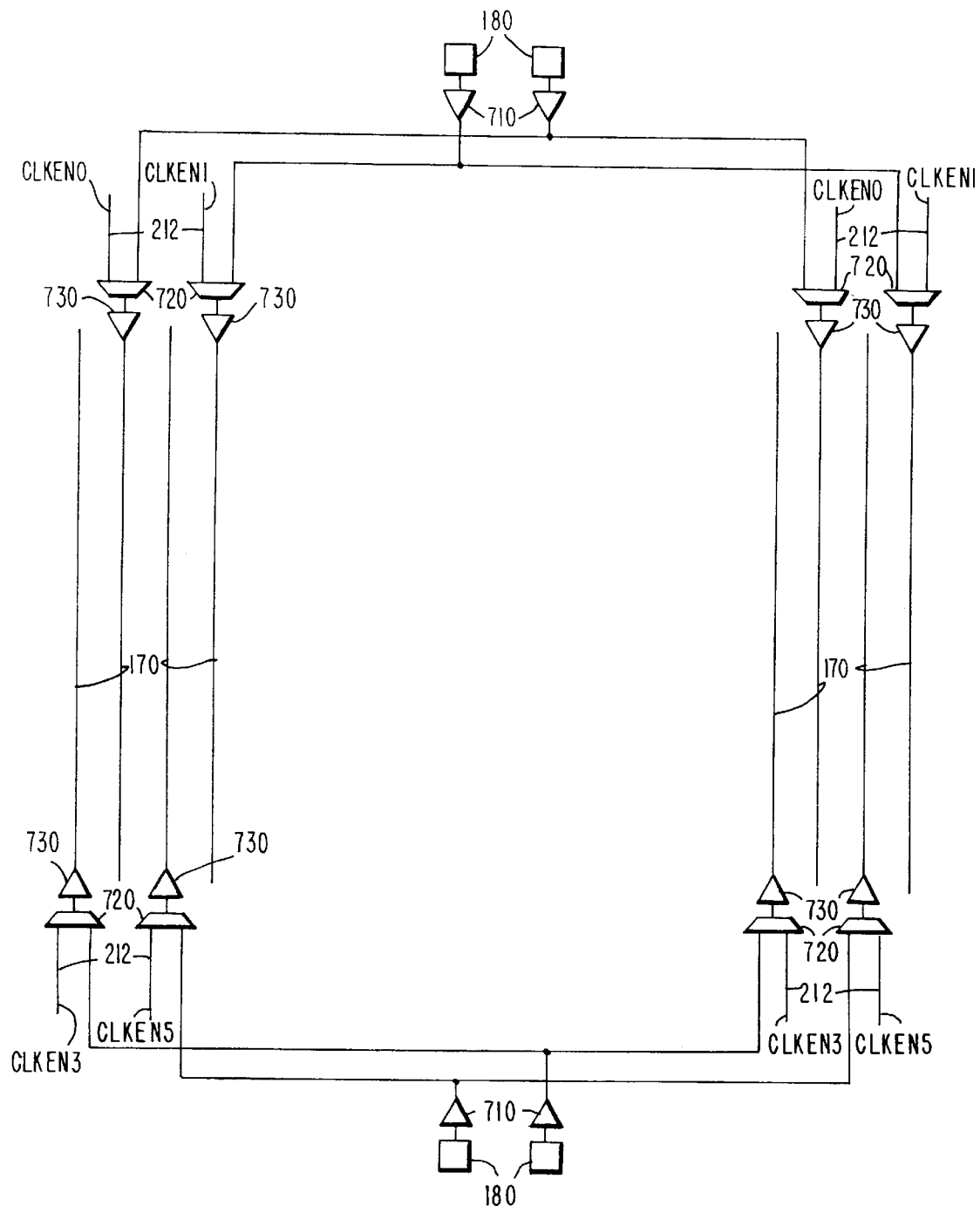
FIG. 10 is a more detailed, but still simplified, schematic block diagram of a portion of the circuitry shown in FIG. 6.

FIG. 10 shows an additional feature of the fast conductor system of device 10. Each of fast input pins 180 is connected (via a TTL buffer 710) to one input terminal of each of two PLCs 720 (multiplexers in the presently preferred embodiment). There are two such PLCs 720 for each fast input because the circuitry is duplicated in the left and right halves of device 10. The input to the PLCs 720 for each of the fast inputs is a respective one of the clock enable signals from peripheral bus conductors 212. Thus the PLCs 720 for each of the fast inputs are programmable to select either the associated fast input 180 or the associated clock enable signal 212 for application to the fast conductors 170 driven (via buffers 730) by those PLCs. Because the signals on conductors 212 are derived from the programmable logic of device 10, the circuitry shown in FIG. 10 allows any of the fast conductor signals to be alternatively derived from device 10 itself, rather than from fast input pins 180.

Figure 11:
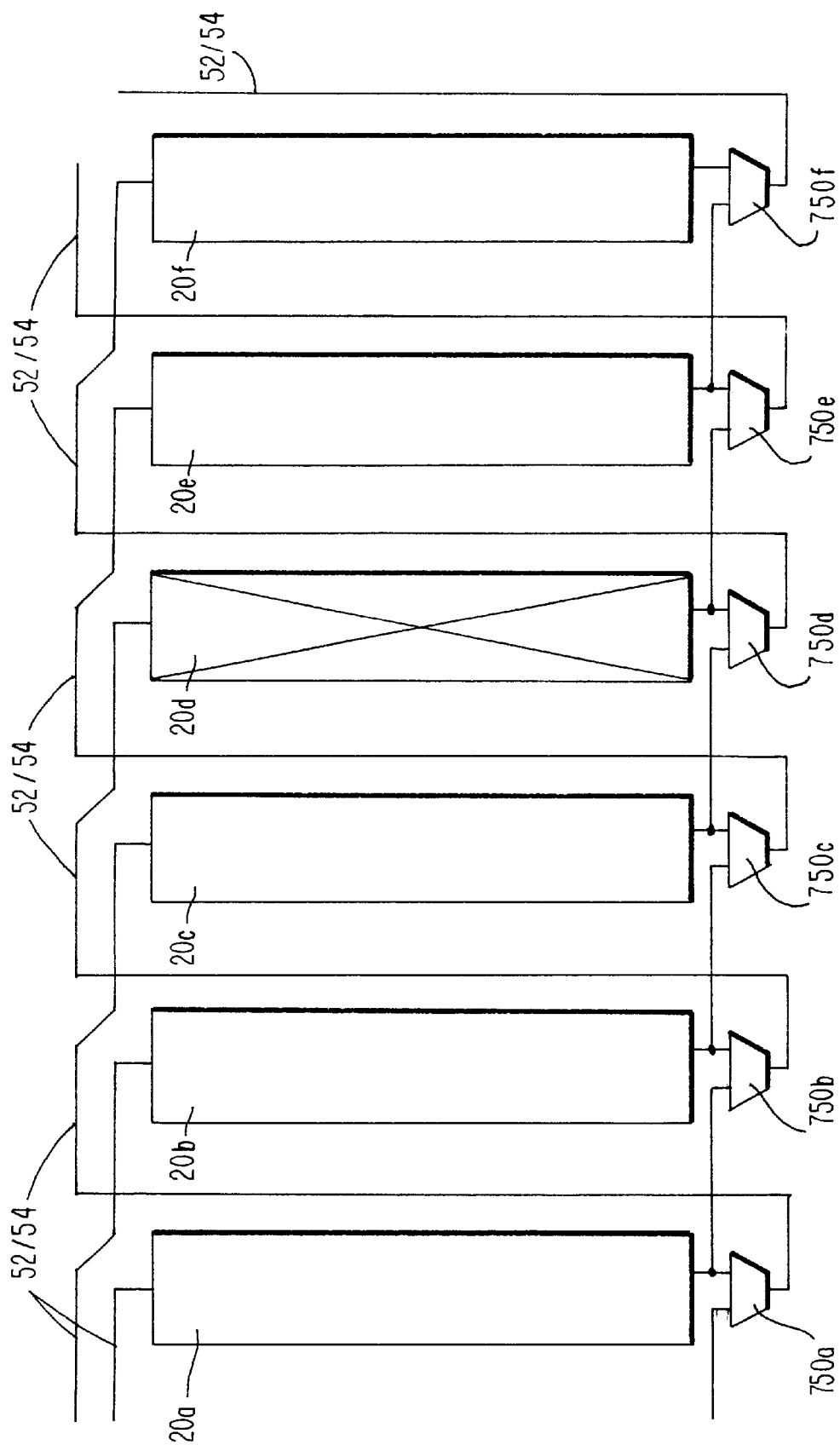
FIG. 11 is a simplified schematic block diagram showing other features of a representative portion of the circuitry shown in FIG. 1.

FIG. 11 shows the manner in which cascade 52 and carry 54 connections are continued from one programmable logic region 20 in a row to another programmable logic region 20 in that row. For ease of reference in this discussion, the logic regions shown in FIG. 11 are designated 20*a* through 20*f*. FIG. 11 shows that the cascade or carry output 52 or 54 of each region 20 is normally connected (through an associated PLC 750) to the cascade or carry input of another region 20 which is spaced from the source region by an intervening region 20. Thus the cascade or carry output 52 or 54 of region 20*a* skips region 20*b* and is applied as a cascade or carry input to region 20*c*. The output 52/54 of region 20*c* in turn skips region 20d and is applied to region 20e. The intervening regions 20 that are interleaved with the chain 20a/20c/20e/ . . . are connected in another similar chain. Thus the cascade or carry output 52 or 54 of region 20b skips region 20c and is applied to region 20d. The output 52/54 of region 20d is applied to region 20f. Skipping intervening regions in these chains helps to spread out long cascade or carry circuits. This helps prevent congestion in the interconnection resources of the device.

FIG. 11 also shows how the cascade and carry chains are continued from region to region in the event of a region being taken out of service due to a defect in that region. In the example shown in FIG. 11 region 20d is a defective and is therefore not used. In that event both of PLCs 750c and 750d are switched to pass the signal from the region 20 to the left of the switch rather than above the switch. Thus PLC 750c is switched so that the cascade or carry output 52 or 54 of region 20b is applied to region 20e, and PLC 750d is switched so that the output 52 or 54 of region 20c is applied to region 20f. Region 20d is cut out of the cascade and carry chains, but at the same time the region-skipping nature of those chains is preserved.

It will be understood that the foregoing is only illustrative of the principles of the invention, and that various modifications can be made by those skilled in the art without departing from the scope and spirit of the invention. For example, changes can be made in the number of logic modules 30 per logic region 20, in the number of rows and/or columns of logic regions 20, in the number of each type of conductor provided, in the size of the RAM regions, etc.

The invention claimed is:

1. A programmable logic device, comprising:
a plurality of logic regions disposed on the device in a two-dimensional array of intersecting rows and columns, each logic region having input terminals and output terminals and being programmable to perform logic functions on input signals applied to its input terminals in generating output signals applied on its output terminals;
a plurality of regions of programmable memory provided in an additional column included within the two-dimensional array of intersecting rows and columns of logic regions;
a plurality of first conductors, each extending along an associated row of logic regions, wherein a first subplurality of the first conductors extend continuously along the associated row, and wherein the first conductors in a second subplurality are each subdivided into a plurality of axially-aligned segments; and
a plurality of second conductors, each extending continuously adjacent to an associated column of logic regions.

2. The programmable logic device of claim 1, wherein each logic region has output interconnect circuitry, and wherein each logic region is associated with some of the first conductors and some of the second conductors, and wherein the output interconnect circuitry is programmably selectively configurable to apply the associated output signals produced by its associated logic region to the first conductors and to the second conductors associated with that logic region.

3. The programmable logic device of claim 2, wherein the output interconnect circuitry within each logic region is further programmably selectively configurable to apply data signals present on the second conductors associated with that logic region to the first conductors associated with that logic region.

4. The programmable logic device of claim 1, wherein each region of programmable memory is associated with a respective one of the rows of logic regions.

5. The programmable logic device of claim 1, wherein each region of programmable memory is programmably operable as any of a plurality of different memory structures, wherein the plurality of different memory structures includes SRAM and ROM.

6. The programmable logic device of claim 1, wherein each region of programmable memory is programmably reconfigurable for operation with different data widths.

7. The programmable logic device of claim 1, wherein each region of programmable memory is programmably selectively operable in synchronous and asynchronous modes.

8. The programmable logic device of claim 1, wherein two or more regions of programmable memory are programmably cascadable to form larger regions of programmable memory.

9. A programmable logic device, comprising:
a plurality of logic regions disposed on the device in a two-dimensional array of intersecting rows and columns, each logic region having input terminals, output terminals, and output interconnect circuitry and being programmable to perform logic functions on input signals applied to its input terminals in generating output signals applied on its output terminals;
a plurality of first conductors, each extending along an associated row of logic regions, wherein a first subplurality of the first conductors extend continuously along the associated row, and wherein the first conductors in a second subplurality are each subdivided into a plurality of axially-aligned segments; and
a plurality of second conductors, each extending continuously adjacent to an associated column of logic regions, wherein
each logic region is associated with some of the first conductors and some of the second conductors, and wherein the output interconnect circuitry within each logic region is programmably selectively configurable to apply the associated output signals produced by its associated logic region to the first conductors and to the second conductors associated with that logic region, and wherein the output interconnect circuitry within each logic region is further programmably selectively configurable to apply data signals present on the second conductors associated with that logic region to the first conductors associated with that logic region, and wherein the output interconnect circuitry of each logic region includes a plurality of programmable multiplexers, wherein each programmable multiplexer has a first input lead on which a respective one of the output signals generated by the logic region is applied, a second input lead on which an associated data signal convey on a respective one of the second conductors is applied, and an output lead which is connected to a respective one of the first conductors associated with that logic region.

10. The programmable logic device of 9, claim wherein the respective output interconnect circuitry associated with a pair of logic regions in adjacent columns are programmably configurable to allow output signals associated with a first logic region in the pair to be programmably conveyable using the associated output interconnect circuitry of a second logic region in the pair.

11. The programmable logic device of claim 9, further comprising:

a spare column of logic regions that is programmably configurable to replace a defective column of logic regions.

12. A programmable logic device, comprising:

a plurality of logic regions disposed on the device in a two-dimensional array of intersecting rows and columns, wherein each logic region includes a plurality of logic modules, each logic module having a plurality of logic module input terminals and a logic module output terminal, and wherein each logic module is programmable to perform logic functions on logic module input signals applied to its logic module input terminals to produce a logic module output signal that is applied on its logic module output terminal;

a plurality of first conductors, each first conductor extending continuously adjacent to and along an entire length of an associated row of logic regions, wherein each logic region is associated with a first subplurality of first conductors that extend along a first side of the associated logic region, and wherein that log c region is further associated with a second subplurality of first conductors that extend along a second side of the associated logic region, wherein the second side is opposite and parallel to the first side;

a plurality of second conductors, each second conductor extending continuously adjacent to and along the entire length of an associated column of logic regions; and output multiplexing circuitry associated with each logic region, wherein the output multiplexing circuitry is configured to multiplex data signals on the second conductors adjacent to the associated logic region with the logic module output signals on the logic module output terminals for application on the first conductors adjacent to the associated logic region.

13. The programmable logic device of claim 12, wherein the output multiplexing circuitry is programmably configurable to selectively convey the associated logic module output signals from a first subplurality of logic modules within the logic region to the first subplurality of first conductors, and wherein the output multiplexing circuitry is further programmably configurable to selectively convey the associated logic module output signals from a second subplurality of logic modules to the second subplurality of first conductors.

14. The programmable logic device of claim 13, wherein the first subplurality of logic modules is mutually exclusive from the second subplurality of logic modules.

15. The programmable logic device of claim 12, wherein each logic region further includes a plurality of third conductors extending adjacent to and along the logic modules within that logic region, and wherein the third conductors are configured to programmably selectively convey logic module input signals from the first conductors adjacent to the logic region to the logic module input terminals in the associated logic region.

16. The programmable logic device of claim 15, wherein each logic region further includes a plurality of feedback conductors extending adjacent to and along the logic modules within that logic region, and wherein the feedback conductors are programmably selectively configurable to provide the associated logic module output signals of the associated logic region as logic module input signals to any of the logic modules in the associated logic region.

17. The programmable logic device of claim 16, wherein the plurality of third conductors within each logic region are adjacent to the plurality of feedback conductors within that logic region.

18. The programmable logic device of claim 17, wherein each logic region further includes a plurality of input conductors and input selection circuitry associated with each logic module input terminal, and wherein the input selection circuitry is configured to programmably selectively connect the associated logic module input terminal to any one of a plurality of input conductors, wherein the plurality of input conductors includes at least one of the third conductors and at least one of the feedback conductors.

19. The programmable logic device of claim 12, wherein each logic region has a carry chain connection, wherein the carry chain connection associated with each logic region is configured to convey a carry signal from a source logic region to a destination logic region, wherein the source logic region is spaced from the destination logic region by at least one intervening logic region.

20. The programmable logic device of claim 12, wherein each logic region has a cascade chain connection, wherein the cascade chain connection associated with each logic region is configured to convey a cascade signal from a source logic region to a destination logic region, wherein the source logic region is spaced from the destination logic region by at least one intervening logic region.

* * * * *